United States Patent
Jiang

(10) Patent No.: US 9,955,587 B2
(45) Date of Patent: Apr. 24, 2018

(54) LED TUBE LAMP

(71) Applicant: JIAXING SUPER LIGHTING ELECTRIC APPLIANCE CO., LTD, Jiaxing (CN)

(72) Inventor: Tao Jiang, Jiaxing (CN)

(73) Assignee: Jiaxing Super Lighting Electric Appliance Co., Ltd., Jiaxing, Zhejiang (CN)

( * ) Notice: Subject to any disclaimer, the term of this patent is extended or adjusted under 35 U.S.C. 154(b) by 111 days.

(21) Appl. No.: 14/859,370

(22) Filed: Sep. 21, 2015

(65) Prior Publication Data

US 2016/0295706 A1    Oct. 6, 2016

Related U.S. Application Data

(63) Continuation-in-part of application No. 14/677,899, filed on Apr. 2, 2015, now Pat. No. 9,625,129, and a
(Continued)

(30) Foreign Application Priority Data

May 19, 2015  (CN) .......................... 2015 1 0259151
Jun. 17, 2015  (CN) .......................... 2015 1 0338027
(Continued)

(51) Int. Cl.
*F21S 4/00* (2016.01)
*H05K 3/36* (2006.01)
(Continued)

(52) U.S. Cl.
CPC ............. *H05K 3/363* (2013.01); *F21K 9/272* (2016.08); *F21Y 2103/10* (2016.08);
(Continued)

(58) Field of Classification Search
CPC .. F21K 9/272; F21Y 2103/10; F21Y 2107/70; F21Y 2115/10; H05K 1/118;
(Continued)

(56) References Cited

U.S. PATENT DOCUMENTS 2,454,049 A    11/1948  Floyd, Jr.
3,294,518 A    12/1966  Laseck
(Continued)

FOREIGN PATENT DOCUMENTS

CN    201014273 Y    1/2008
CN    201363601      12/2009
(Continued)

*Primary Examiner* — Tsion Tumebo
(74) *Attorney, Agent, or Firm* — Muir Patent Law, PLLC

(57) ABSTRACT

An LED tube lamp including a lamp tube, an end cap attached to an end of the lamp tube, a power supply disposed in the end cap, and an LED light bar disposed inside the lamp tube. The LED light bar is mounted with LED light sources which are electrically connected to the power supply by way of the LED light bar. The LED light bar includes a bendable circuit sheet which is longer than the lamp tube. A soldering pad is configured and disposed at an end of the bendable circuit sheet. The soldering pad is formed with a through-hole or a notch to allow tin solder to pass through when soldering such that the bendable circuit sheet can be directly soldered and electrically connected to the power supply.

13 Claims, 25 Drawing Sheets

Related U.S. Application Data continuation-in-part of application No. 14/724,840, filed on May 29, 2015, now Pat. No. 9,625,137, and a continuation-in-part of application No. 14/818,224, filed on Aug. 4, 2015, now Pat. No. 9,611,984.

(30) Foreign Application Priority Data

| Jun. 26, 2015 | (CN) | 2015 1 0372375 |
|---|---|---|
| Jun. 26, 2015 | (CN) | 2015 1 0373492 |
| Aug. 7, 2015 | (CN) | 2015 1 0482944 |
| Aug. 8, 2015 | (CN) | 2015 1 0483475 |

(51) Int. Cl.

| F21K 9/272 | (2016.01) |
|---|---|
| F21Y 103/10 | (2016.01) |
| F21Y 115/10 | (2016.01) |
| F21Y 107/70 | (2016.01) |
| H05K 1/11 | (2006.01) |
| H05K 1/18 | (2006.01) |

(52) U.S. Cl.
CPC ....... *F21Y 2107/70* (2016.08); *F21Y 2115/10* (2016.08); *H05K 1/118* (2013.01); *H05K 1/189* (2013.01); *H05K 2201/0969* (2013.01); *H05K 2201/09181* (2013.01); *H05K 2201/10106* (2013.01)

(58) Field of Classification Search
CPC ......... H05K 1/189; H05K 2201/09181; H05K 2201/0969; H05K 2201/10106; H05K 3/363
USPC ..................................... 362/249.02
See application file for complete search history.

(56) References Cited

U.S. PATENT DOCUMENTS

| 4,156,265 | A | 5/1979 | Rose |
| 4,647,399 | A | 3/1987 | Peters et al. |
| 5,575,459 | A | 11/1996 | Anderson |
| 5,921,660 | A | 7/1999 | Yu |
| 6,118,072 | A | 9/2000 | Scott |
| 6,127,783 | A | 10/2000 | Pashley |
| 6,186,649 | B1 | 2/2001 | Zou et al. |
| 6,211,262 | B1 | 4/2001 | Mejiritski et al. |
| 6,609,813 | B1 | 8/2003 | Showers |
| 6,796,680 | B1 | 9/2004 | Showers |
| 6,860,628 | B2 | 3/2005 | Robertson et al. |
| 6,936,855 | B1 | 8/2005 | Harrah et al. |
| 7,033,239 | B2 | 4/2006 | Cunkelman |
| 7,067,032 | B1 | 6/2006 | Bremont et al. |
| 7,594,738 | B1 | 9/2009 | Lin et al. |
| 8,360,599 | B2 | 1/2013 | Ivey |
| 8,456,075 | B2 | 6/2013 | Axelsson |
| 8,579,463 | B2 | 11/2013 | Clough |
| D761,216 | S | 7/2016 | Jiang |
| 9,447,929 | B2 | 9/2016 | Jiang |
| D768,891 | S | 10/2016 | Jiang et al. |
| D797,323 | S | 9/2017 | Yang et al. |
| 2002/0044456 | A1 | 4/2002 | Balestriero |
| 2003/0189829 | A1 | 10/2003 | Shimizu et al. |
| 2003/0231485 | A1 | 12/2003 | Chien |
| 2004/0095078 | A1 | 5/2004 | Leong |
| 2004/0189218 | A1 | 9/2004 | Leong |
| 2005/0128751 | A1 | 6/2005 | Roberge |
| 2005/0162850 | A1* | 7/2005 | Luk ............... H05B 33/0857 362/227 |
| 2005/0168123 | A1 | 8/2005 | Taniwa |
| 2005/0185396 | A1 | 8/2005 | Kutler |
| 2005/0207166 | A1 | 9/2005 | Kan |
| 2005/0213321 | A1 | 9/2005 | Lin |
| 2006/0028837 | A1 | 2/2006 | Mrakovich et al. |
| 2007/0001709 | A1 | 1/2007 | Shen |
| 2007/0145915 | A1 | 6/2007 | Roberge |
| 2007/0210687 | A1 | 9/2007 | Axelsson |
| 2007/0274084 | A1 | 11/2007 | Kan |
| 2008/0030981 | A1 | 2/2008 | Mrakovich |
| 2008/0192476 | A1 | 8/2008 | Hiratsuka |
| 2008/0278941 | A1 | 11/2008 | Logan |
| 2008/0290814 | A1 | 11/2008 | Leong et al. |
| 2009/0040415 | A1* | 2/2009 | Kim ................... G02F 1/13452 349/56 |
| 2009/0140271 | A1 | 6/2009 | Sah |
| 2009/0159919 | A1 | 6/2009 | Simon et al. |
| 2009/0161359 | A1 | 6/2009 | Siemiet |
| 2010/0085772 | A1 | 4/2010 | Song et al. |
| 2010/0177532 | A1 | 7/2010 | Simon et al. |
| 2010/0201269 | A1* | 8/2010 | Tzou ................... F21V 23/006 315/51 |
| 2010/0220469 | A1 | 9/2010 | Ivey et al. |
| 2010/0253226 | A1 | 10/2010 | Oki |
| 2010/0277918 | A1 | 11/2010 | Chen et al. |
| 2011/0038146 | A1 | 2/2011 | Chen |
| 2011/0057572 | A1 | 3/2011 | Kit et al. |
| 2011/0084554 | A1 | 4/2011 | Tian et al. |
| 2011/0084608 | A1 | 4/2011 | Lin et al. |
| 2011/0084627 | A1 | 4/2011 | Sloan et al. |
| 2011/0090684 | A1 | 4/2011 | Logan |
| 2011/0216538 | A1 | 9/2011 | Logan |
| 2011/0279063 | A1 | 11/2011 | Wang et al. |
| 2011/0309745 | A1 | 12/2011 | Westermarck |
| 2012/0049684 | A1 | 3/2012 | Bodenstein et al. |
| 2012/0069556 | A1 | 3/2012 | Bertram |
| 2012/0106157 | A1 | 5/2012 | Simon |
| 2012/0146503 | A1 | 6/2012 | Negley et al. |
| 2012/0153873 | A1 | 6/2012 | Hayashi |
| 2012/0169968 | A1 | 7/2012 | Ishimori et al. |
| 2012/0253226 | A1 | 8/2012 | Lai et al. |
| 2012/0293991 | A1 | 11/2012 | Lin |
| 2012/0319150 | A1 | 12/2012 | Shimomura et al. |
| 2013/0021809 | A1 | 1/2013 | Dellian et al. |
| 2013/0033881 | A1 | 2/2013 | Terazawa et al. |
| 2013/0033888 | A1 | 2/2013 | Wel et al. |
| 2013/0050998 | A1 | 2/2013 | Chu et al. |
| 2013/0069538 | A1 | 3/2013 | So |
| 2013/0094200 | A1 | 4/2013 | Dellian et al. |
| 2013/0135852 | A1 | 5/2013 | Chan |
| 2013/0170196 | A1 | 7/2013 | Huang et al. |
| 2013/0170245 | A1 | 7/2013 | Hong |
| 2013/0182425 | A1 | 7/2013 | Seki |
| 2013/0223053 | A1 | 8/2013 | Liu et al. |
| 2013/0230995 | A1* | 9/2013 | Ivey ................... F21K 9/90 439/226 |
| 2013/0250565 | A1 | 9/2013 | Chiang et al. |
| 2013/0256704 | A1 | 10/2013 | Hsiao et al. |
| 2013/0258650 | A1 | 10/2013 | Sharrah |
| 2013/0293098 | A1 | 11/2013 | Li et al. |
| 2014/0071667 | A1 | 3/2014 | Hayashi |
| 2014/0153231 | A1 | 6/2014 | Bittmann |
| 2014/0192526 | A1 | 7/2014 | Qiu |
| 2014/0225519 | A1 | 8/2014 | Yu |
| 2014/0226320 | A1 | 8/2014 | Halliwell |
| 2014/0331532 | A1* | 11/2014 | Deppiesse ............... F21S 4/005 40/541 |
| 2015/0009688 | A1 | 1/2015 | Timmermans |
| 2015/0176770 | A1 | 6/2015 | Wilcox et al. |
| 2015/0327368 | A1* | 11/2015 | Su ........................ H05K 1/118 174/254 |
| 2016/0091147 | A1 | 3/2016 | Jiang et al. |
| 2016/0091156 | A1 | 3/2016 | Li et al. |
| 2016/0091179 | A1 | 3/2016 | Jiang et al. |
| 2016/0102813 | A1 | 4/2016 | Ye et al. |
| 2016/0178135 | A1 | 6/2016 | Xu et al. |
| 2016/0178137 | A1 | 6/2016 | Jiang |
| 2016/0178138 | A1 | 6/2016 | Jiang |
| 2016/0198535 | A1 | 7/2016 | Ye et al. |
| 2016/0212809 | A1 | 7/2016 | Xiong et al. |
| 2016/0215936 | A1 | 7/2016 | Jiang |
| 2016/0215937 | A1 | 7/2016 | Jiang |
| 2016/0219658 | A1 | 7/2016 | Xiong et al. |

(56) References Cited

U.S. PATENT DOCUMENTS

| | | |
|---|---|---|
| 2016/0219666 A1 | 7/2016 | Xiong et al. |
| 2016/0219672 A1 | 7/2016 | Liu |
| 2016/0223180 A1 | 8/2016 | Jiang |
| 2016/0223182 A1 | 8/2016 | Jiang |
| 2016/0229621 A1 | 8/2016 | Jiang et al. |
| 2016/0255694 A1 | 9/2016 | Jiang et al. |
| 2016/0255699 A1 | 9/2016 | Ye et al. |
| 2016/0270163 A1 | 9/2016 | Hu et al. |
| 2016/0270164 A1 | 9/2016 | Xiong et al. |
| 2016/0270165 A1 | 9/2016 | Xiong et al. |
| 2016/0270166 A1 | 9/2016 | Xiong et al. |
| 2016/0270173 A1 | 9/2016 | Xiong |
| 2016/0270184 A1 | 9/2016 | Xiong et al. |
| 2016/0290566 A1 | 10/2016 | Jiang et al. |
| 2016/0290567 A1 | 10/2016 | Jiang et al. |
| 2016/0290568 A1 | 10/2016 | Jiang et al. |
| 2016/0290569 A1 | 10/2016 | Jiang et al. |
| 2016/0290570 A1 | 10/2016 | Jiang et al. |
| 2016/0290598 A1 | 10/2016 | Jiang |
| 2016/0290609 A1 | 10/2016 | Jiang et al. |
| 2016/0295706 A1 | 10/2016 | Jiang |
| 2016/0309550 A1 | 10/2016 | Xiong et al. |
| 2016/0323948 A1 | 11/2016 | Xiong et al. |
| 2016/0341414 A1 | 11/2016 | Jiang |
| 2016/0356472 A1 | 12/2016 | Liu et al. |
| 2016/0363267 A1 | 12/2016 | Jiang et al. |
| 2016/0381746 A1 | 12/2016 | Ye et al. |
| 2016/0381760 A1 | 12/2016 | Xiong et al. |
| 2017/0001793 A1 | 1/2017 | Jiang et al. |
| 2017/0038012 A1 | 2/2017 | Jiang et al. |
| 2017/0038013 A1 | 2/2017 | Liu et al. |
| 2017/0038014 A1 | 2/2017 | Jiang et al. |
| 2017/0089521 A1 | 3/2017 | Jiang |
| 2017/0089530 A1 | 3/2017 | Jiang |
| 2017/0130911 A1 | 5/2017 | Li et al. |
| 2017/0159894 A1 | 6/2017 | Jiang |
| 2017/0167664 A1 | 6/2017 | Li et al. |
| 2017/0211753 A1 | 7/2017 | Jiang et al. |
| 2017/0219169 A1 | 8/2017 | Jiang |
| 2017/0311398 A1 | 10/2017 | Jiang et al. |

FOREIGN PATENT DOCUMENTS

| | | |
|---|---|---|
| CN | 201437921 | 4/2010 |
| CN | 102052652 | 5/2011 |
| CN | 102116460 | 7/2011 |
| CN | 102121578 | 7/2011 |
| CN | 202125774 | 1/2012 |
| CN | 202125774 U | 1/2012 |
| CN | 202216003 | 5/2012 |
| CN | 102518972 | 6/2012 |
| CN | 102518972 A | 6/2012 |
| CN | 202302841 | 7/2012 |
| CN | 102720901 | 10/2012 |
| CN | 102777788 | 11/2012 |
| CN | 102889446 | 1/2013 |
| CN | 202791824 U | 3/2013 |
| CN | 203068187 | 7/2013 |
| CN | 203240337 | 10/2013 |
| CN | 203240337 U | 10/2013 |
| CN | 203240337 U | 10/2013 |
| CN | 203363984 | 12/2013 |
| CN | 203384716 U | 1/2014 |
| CN | 203413396 U | 1/2014 |
| CN | 203453866 U | 2/2014 |
| CN | 203464014 | 3/2014 |
| CN | 103742875 | 4/2014 |
| CN | 203549435 | 4/2014 |
| CN | 203585876 U | 5/2014 |
| CN | 203615157 | 5/2014 |
| CN | 103851547 | 6/2014 |
| CN | 203771102 | 8/2014 |
| CN | 104033772 | 9/2014 |
| CN | 203927469 | 11/2014 |
| CN | 203927469 U | 11/2014 |
| CN | 203963553 U | 11/2014 |
| CN | 204042527 | 12/2014 |
| CN | 204201535 U | 3/2015 |
| CN | 204268162 | 4/2015 |
| CN | 204268162 U | 4/2015 |
| CN | 204300737 | 4/2015 |
| CN | 204300737 U | 4/2015 |
| CN | 104595765 | 5/2015 |
| CN | 104595765 A | 5/2015 |
| CN | 204420636 | 6/2015 |
| CN | 204420636 U | 6/2015 |
| CN | 104776332 | 7/2015 |
| CN | 104832813 A | 8/2015 |
| CN | 204573639 | 8/2015 |
| EP | 2554899 | 2/2013 |
| EP | 3146803 | 3/2017 |
| GB | 2519258 | 4/2015 |
| GB | 2523275 | 8/2015 |
| GB | 2531425 | 4/2016 |
| JP | 2008117666 | 5/2008 |
| JP | 2011061056 | 3/2011 |
| JP | 2014154479 | 8/2014 |
| KR | 20120000551 | 1/2012 |
| KR | 1020120055349 | 5/2012 |
| WO | WO2011/132120 | 10/2011 |
| WO | WO2011/132120 A1 | 10/2011 |
| WO | WO2012129301 | 9/2012 |
| WO | WO2013/125803 | 8/2013 |
| WO | WO2013/125803 A1 | 8/2013 |
| WO | WO2014/001475 | 1/2014 |
| WO | WO2014/001475 A1 | 1/2014 |
| WO | WO 2014/118754 | 8/2014 |
| WO | WO2014117435 | 8/2014 |
| WO | WO2015/036478 | 3/2015 |
| WO | WO2015/036478 A1 | 3/2015 |
| WO | WO2015081809 | 6/2015 |
| WO | WO2016086901 | 6/2016 |

\* cited by examiner

LED TUBE LAMP

FIELD OF THE INVENTION

The present invention relates to an LED tube lamp, and more particularly to an LED tube lamp having a LED light bar that is a bendable circuit sheet, a plurality of electronic components and an end cap.

BACKGROUND OF THE INVENTION

A conventional LED tube lamp typically includes a lamp tube, a light bar configured with a plurality of LED light sources thereon, and an end cap configured on both ends of the lamp tube. The end cap has a power supply disposed therein, and the LED light sources and the power supply are electrically connected by the light bar. The conventional LED tube lamp possesses several common quality problems or issues such as the following: (1) The light bar is typically a rigid board or plate, thus upon breakage or rupture of the lamp tube (the lamp tube is typically made of glass, which is easy to break), such as partial breakage when broken into two parts, the entire lamp tube is still able to maintain a straight tube configuration, then the user may be under a false impression the LED tube lamp still remains usable and fully functional, and thus easy to cause electric shock or current leakage upon handling or installation thereof. (2) The rigid light bar is typically electrically connected to the end cap using metal conductive wires through wire bonding technique, which sometimes results in occasional or sporadic breakage of the metal conductive wires during manufacturing, transportation, and/or usage of the LED tube lamp, which then render the LED tube lamp unusable. (3) Conventional tube lamp configured with the plastic end caps requires a tedious process for performing adhesive bonding attachment and because the adhesive bonding process requires a significant amount of time to perform, production bottleneck or difficulties are resulted. In addition, manual operation or labor are required to perform such adhesive bonding process, thus would be difficult for manufacturing optimization using automation. The adhesive used are typically silicone adhesive or hot melt adhesive which are easily prone to overflow and spillover that are difficult to control or limit, and that the overflow or spillover of the hot melt adhesive requires removal by performing of manual adhesive wipe off or clean off so as to preserve aesthetic appearance of the LED tube lamp. (4) The conventional lamp tube is typically of a substantially uniformly round cylindrical structure, with the end cap fittingly sleeved on the outside of the lamp tube, and is adhesively bonded to the lamp tube. As a result, the outside diameter of the end cap is larger than the outside diameter of the lamp tube. During shipping or transport of the LED lamp tube, the shipping packaging support/bracket only makes direct contact with the end caps, thus rendering the end caps as being the only load/stress points, which can easily lead to breakage of the glass lamp tube. Referring to US patent publication no. 20100103673, which discloses of an end cap made of glass, with the end cap to be inserted into the glass lamp tube, thereby producing an exerting opposing force at both ends of the lamp tube from inside towards outside thereof, but from a outside towards the inside perspective of the glass lamp tube, the amount of accommodating force which can be tolerated by the glass lamp tube is reduced, thus causing easier breakage of the glass lamp tube at a same amount of force exertion from outside source. (5) The conventional LED tube lamp has the LED light sources spatially arranged and configured on the light bar, but because of the illumination and optical properties of each of the LED chips, grainy spots would be produced from illumination of the LED lamp tube when no further optical treatment or manipulation is additionally performed, thus negatively affect illumination quality. For example, a person can view the illuminating light directly coming from the LED light sources so as to produce the resulting visual graininess effect. To solve above problem, Chinese patent application CN201320748271.6 introduced a light diffuser tube and placed into a glass tube, in order to reduce the negative grainy visual effects. However, the presence of the light diffuser tube adds an additional interface medium to increase the overall light propagation path, which increases the probability of total reflection of light propagation thereby reducing light output efficiency. In addition, due to the light absorbing nature of the light diffuser tube, it will result in reduced light output efficiency.

SUMMARY OF THE INVENTION

The present invention provides an LED tube lamp according to various embodiments for solving the above issues and problems.

According to one embodiment, the present invention provides an LED tube lamp, comprising a lamp tube, and an end cap configured and disposed at an end of the lamp tube, a power supply disposed in the end cap, an LED light bar disposed in the lamp tube, a plurality of LED light sources disposed on the LED light bar, in which the LED light sources and the power supply are electrically connected by the LED light bar, and the LED light bar includes a bendable circuit sheet.

Selectively, the bendable circuit sheet is a single-layered wiring layer (having electrical conductivity), the LED light sources are configured and disposed on the wiring layer, and are electrically connected to the power supply via the single-layered wiring layer.

Selectively, the bendable circuit sheet includes a dielectric layer disposed on the wiring layer in a stacked manner, the dielectric layer is disposed on opposite side of the wiring layer away from the side of the light sources, and is mounted on the inner circumferential surface of the lamp tube.

Selectively, the bendable circuit sheet is extending along a circumferential direction of the lamp tube, and a ratio of the circumferential length of the bendable circuit sheet along the inner circumferential surface of the lamp tube to the circumferential length of the inner circumferential surface of the lamp tube is 0.2 to 0.5 and preferably 0.3 to 0.5.

Selectively, the bendable circuit sheet further includes a circuit protection layer.

Selectively, the bendable circuit sheet can be electrically connected to the power supply via wire bonding.

Selectively, the bendable circuit sheet at both ends thereof is not fixed to the inner circumferential surface of the lamp tube along an axial direction of the lamp tube.

Selectively, the bendable circuit sheet at both ends thereof are forming a freely extending end portion, respectively, in which the freely extending end portion is deformed in shape and contracted or curled up to fit inside the lamp tube.

Selectively, the bendable circuit sheet includes multiple numbers of the wiring layers and the dielectric layers, in which the wiring layers and the dielectric layers are sequentially disposed in stacked and staggered manner, with the light sources disposed on an uppermost layer of the multiple numbers of wiring layers and electrically connected to the power supply via the uppermost layer of the multiple numbers of wiring layers.

According to another embodiment, the present invention provides an LED tube lamp in which the LED light bar therein includes a bendable circuit sheet disposed with a soldering pad at an end of the bendable circuit sheet. The soldering pad has a hole formed therein.

According to still another embodiment, the present invention provides an LED tube lamp to have the power supply comprising a printed circuit board disposed with a soldering pad corresponding to the soldering pad of the bendable circuit sheet, and the soldering pad of the bendable circuit sheet is electrically connected to the soldering pad of the printed circuit board of the power supply to provide electrical connection between the power supply and the LED light sources.

Selectively, the soldering pad of the bendable circuit sheet and the soldering pad of the printed circuit board of the power supply point toward same direction when soldering.

Selectively, the soldering pad of the bendable circuit sheet and the soldering pad of the printed circuit board of the power supply point toward opposite directions when soldering.

In the abovementioned embodiments, more than one soldering pad is disposed on the bendable circuit sheet.

Selectively, two soldering pads are disposed on the bendable circuit sheet, and an electrically insulating hole is formed and disposed between the two soldering pads of the bendable circuit sheet to prevent from short circuit between the two soldering pads when soldering.

Selectively, an alignment hole is configured and disposed behind the electrically insulating hole to allow a soldering machine to automatically locate the soldering pads of the bendable circuit sheet.

Selectively, at least three soldering pads are disposed on the bendable circuit sheet and arranged in one row or two rows.

Selectively, at least one of the soldering pads is formed with a through-hole, which has a diameter of 1 mm to 2 mm.

Selectively, the soldering pad of the bendable circuit board is formed with a solder ball above the through-hole after soldering is completed, and a diameter of the solder ball is larger than the diameter of the through-hole.

In the abovementioned embodiments, a distance between the through-hole and an edge of the bendable circuit sheet is 1 mm or less.

Selectively, at least one of the soldering pads is formed with a notch at an edge of the bendable circuit sheet.

Selectively, the soldering pad of the bendable circuit board is formed with a solder ball above the notch after soldering is completed, and a diameter of the solder ball is larger than a diameter of the notch.

According to still another embodiment, the present invention provides an LED tube lamp in which the LED light bar therein includes a bendable circuit sheet with a length longer than a length of the lamp tube and is disposed with at least one soldering pad at an end of the bendable circuit sheet, and the power supply is disposed with a soldering pad corresponding to the soldering pad of the bendable circuit sheet.

Selectively, the bendable circuit sheet is formed with a hole near the at least one soldering pad.

Selectively, the at least one soldering pad is formed with a through-hole.

Selectively, the at least one soldering pad is formed with a notch at an edge of the bendable circuit sheet.

Selectively, a soldered tin between the soldering pad of the bendable circuit board and the soldering pad of the power supply forms a rivet-like structure. The rivet-like structure may be C-shaped.

According to still another embodiment, the present invention provides an LED tube lamp in which a LED light bar includes a bendable circuit sheet with a length longer than a length of the lamp tube to form a freely extending end portion at one end of the bendable circuit sheet, the end of the bendable circuit sheet is disposed with at least one soldering pad, the at least one soldering pad is formed with either a through-hole or a notch, and the power supply is disposed with a soldering pad corresponding to the soldering pad of the bendable circuit sheet.

Selectively, the lamp tube includes a main region and a rear end region, in which an outer diameter of the rear end region is less than an outer diameter of the main region, the rear end region is fittingly sleeved with the end cap.

Selectively, a transition region is disposed and configured between the main region and the rear end region of the lamp tube.

Selectively, the bendable circuit sheet is passed through the transition region of the lamp tube to be electrically connected to the power supply, two ends of the transition region are arc-shaped, outer surfaces of the transition regions adjacent to the main region are under tension force and inner surfaces of the transition regions adjacent to the main region are under compression force, outer surfaces of the transition regions adjacent to the rear end region are under compression force and inner surfaces of the transition regions adjacent to the rear end region are under tension force. One arc-shaped surface at the end thereof near the main region is curved towards inside of the glass lamp tube, and the other arc-shaped surface at the end thereof near the rear end region is curved toward outside of glass lamp tube. The normal vector of the arc-shaped surface at the end of the transition region near the main region points towards outside of the lamp tube, and the normal vector of the arc-shaped surface at the end of the transition region near the rear end region points towards inside of the lamp tube. The included angle formed between the transition region and the main region and the included angle formed between the transition region and the rear end region are larger than 90 degrees, respectively.

Selectively, a length of the transition region is between 1 mm to 4 mm, and other lengths are also possible for the transition region in some embodiments.

Selectively, the LED tube lamp further comprising a diffusion layer, light paths of the light sources are passed through the diffusion layer and then transmitted through the lamp tube.

Selectively, the inner circumferential surface of the lamp tube is further provided with a reflective film layer thereon, extending along a circumferential direction of the lamp tube to occupy a portion of an area of the inner circumferential surface.

Selectively, the bendable circuit sheet is disposed on the reflective film layer.

Selectively, the bendable circuit sheet is disposed on one side of the reflective film layer, extending along the circumferential direction of the lamp tube.

Selectively, a ratio of a circumferential length of the reflective film layer along the inner circumferential surface of the lamp tube to a circumferential length of the lamp tube is 0.3 to 0.5.

Selectively, the diffusion film layer is a diffusion coating layer, covering the inner circumferential surface or the outer circumferential surface of the lamp tube.

Selectively, the diffusion film layer is a diffusion coating layer, covering an outer surface of the light sources.

Selectively, a thickness of the diffusion film layer is between 20 μm~30 μm.

Selectively, the diffusion film layer is a diffusion film covering above or over the light sources without directly contacting with the light source.

Selectively, a light transmittance of the diffusion layer is at least greater than 85%.

Selectively, the diffusion film layer has an average thickness ranging from 200 μm to 300 μm and a light transmittance ranging from 92% to 94%.

According to still another embodiment, the present invention provides an LED tube lamp, comprising a lamp tube and an end cap fittingly sleeved over at an end of the lamp tube, the end cap comprising an electrically insulating tubular part, sleeved over outside of the end of the lamp tube, a magnetic metal member, fixedly-disposed an inner circumferential surface of the electrically insulating tubular part, at least a portion of the magnetic metal member is fixedly arranged in between the inner circumferential surface of the electrically insulating tubular part of the end cap and the rear end region of the lamp tube.

Selectively, the magnetic metal member and the rear end region of the lamp tube are bonded together or fixedly-arranged by an adhesive.

Selectively, the magnetic metal member and the rear end region of the lamp tube are bonded together or fixedly-arranged by a hot melt adhesive.

Selectively, the magnetic metal member is entirely disposed inside the electrically insulating tubular part of the end cap, and the hot melt adhesive is coated over the entirety of inner circumferential surface of the magnetic metal member.

Selectively, the inner circumferential surface of the electrically insulating tubular part has a plurality of supporting portions configured along in a radial direction extending toward interior thereof, in which the magnetic metal member is abutted against the supporting portions along an axial direction.

Selectively, a protruding thickness of the supporting portion toward the interior of the electrically insulating tubular part in a radial direction is between 1 mm to 2 mm.

Selectively, the inner circumferential surface of the electrically insulating tubular part has a plurality of protruding portions configured inwardly protruding along a radial direction thereof, in which the thickness of the protruding portion is smaller than the thickness of the supporting portion.

Selectively, the thickness of the protruding portion ranges from 0.2 mm to 1.0 mm.

Selectively, the protruding portions are arranged along an annular configuration in the circumferential direction of the electrically insulating tubular part, or the protruding portions include a plurality of protruding pieces, the protruding pieces are spatially-arranged along the inner circumference of the electrically insulating tubular part.

Selectively, the protruding pieces are arranged equidistantly spaced along the inner circumference of the electrically insulating tubular part.

Selectively, the protruding pieces are arranged non-equidistantly spaced along the inner circumference of the electrically insulating tubular part.

Selectively, an inner diameter of the magnetic metal member is larger than an outer diameter of the rear end region of the lamp tube.

Selectively, the two ends of the transition region are arc-shaped.

Selectively, the arc-shaped portion of the transition region to connect the main region has a radius of curvature R1 less than a radius of curvature R2 of the arc-shaped portion of the transition region to connect the rear end region, and a ratio of the radius of curvature between R1 and R2 ranges from 1:1.5 to 1:10.

Selectively, there is no gap between the main region and the end cap.

Selectively, the arc-shaped portion of the transition region has an arc angle being larger than 90 degrees, and the cross section of the rear end region is a flat surface that is parallel to the main region.

Selectively, the power supply comprising a metal pin at one end thereof, the end cap comprising a hollow conductive pin, configured for allowing the metal pin of the power supply to be inserted therein for electrical connection.

According to still another embodiment, the present invention provides an LED tube lamp, comprising a lamp tube and an end cap fittingly sleeved over the lamp tube, the end cap comprising an electrically insulating tubular part, sleeved over outside of the end of the lamp tube, and a thermal conductive ring, fixedly disposed over and surrounding an outer circumferential surface of the electrically insulating tubular part, the thermal conductive ring and the lamp tube are adhesively bonded.

Selectively, the electrically insulating tubular part of the end cap includes a first tubular part and a second tubular part, the first tubular part and the second tubular part are connected along an axial direction of the lamp tube, in which the outer diameter of the second tubular part is less than the outer diameter of the first tubular part.

Selectively, the thermal conductive ring is fixedly-configured over and surrounding the outer circumferential surface of the second tubular part, and the outer circumferential surface of the thermal conductive ring is substantially flush with respect to the outer circumferential surface of the first tubular part.

Selectively, at least a portion of the second tubular part is sleeved over the lamp tube, with the thermal conductive ring and the lamp tube bonded or joined together by the hot melt adhesive disposed therebetween.

Selectively, the end of the second tubular part located away from the first tubular part is provided with one or more notches, which are spatially arranged along a circumferential direction of the second tubular part.

Selectively, a ratio of the length of the thermal conductive ring along the axial direction of the end cap with respect to the axial length of the electrically insulating tubular part ranges from 1:2.5 to 1:5.

Selectively, the axial length of the lamp tube which is inserted into the end cap accounts for one-third (⅓) to two-thirds (⅔) of the total length of the thermal conductive ring in an axial direction thereof.

Selectively, the outer diameter difference between the first tubular part and the second tubular part ranges from 0.15 mm to 0.30 mm.

Selectively, the thermal conductive ring is a metal sheet.

Selectively, the thermal conductive ring is tubular in shape.

Selectively, the electrically insulating tubular part is a plastic tube.

Selectively, the lamp tube is a glass tube.

Selectively, the lamp tube includes a main region and a rear end region disposed at each end of the main region, the rear end region is fittingly sleeved with the end cap, in which the outer diameter of the rear end region is less than outer diameter of the main region, and the outer diameter of the rear end region is the same as the outer diameter of the main region.

Selectively, when the outer diameter of the rear end region is less than outer diameter of the main region, the outer diameter difference between the rear end region and the main region ranges from 1 mm to 10 mm.

Selectively, the outer diameter difference between the rear end region and the main region ranges from 2 mm to 7 mm.

Selectively, the inner circumferential surface of the second tubular part and the inner circumferential surface of the thermal conductive ring, the outer circumferential surface of the rear end region and the outer circumferential surface of the transition region together form an accommodation space.

Selectively, the hot melt adhesive is disposed inside the accommodation space.

Selectively, the hot melt adhesive does not completely fill up the accommodation space.

Selectively, a portion of the hot melt adhesive is disposed in an overlapped region between the inner circumferential surface of the thermal conductive ring and the outer circumferential surface of the rear end region.

Selectively, the hot melt adhesive is contained in the overlapped region as shown by a first virtual dissecting plane sequentially cutting through the thermal conductive ring, the hot melt adhesive, and the outer circumferential surface of the lamp tube along the radial direction of the lamp tube.

Selectively, the hot melt adhesive is contained in the overlapped region as shown by a second virtual dissecting plane sequentially cutting through the thermal conductive ring, the second tubular part, the hot melt adhesive, and the rear end region of the lamp tube along the radial direction of the lamp tube.

Selectively, the hot melt adhesive is contained in the overlapped region as shown by a first virtual dissecting plane sequentially cutting through the thermal conductive ring, the hot melt adhesive, and the outer circumferential surface of the lamp tube along the redial direction of the lamp tube; and the hot melt adhesive is contained in the overlapped region shown by a second virtual dissecting plane sequentially cutting through the thermal conductive ring, the second tubular part, the hot melt adhesive, and the rear end region of the lamp tube along the redial direction of the lamp tube.

Selectively, the power supply has an output terminal that is a metal plug, and the end cap has a hollow conductive pin for coupling with the output terminal of the power supply for providing electrical connection therebetween.

According to still another embodiment, the present invention provides an LED tube lamp with the included LED light source comprising an LED lead frame having a recess, and an LED chip disposed in the recess, wherein the LED lead frame comprises a first sidewall and a second sidewall with a height of the first sidewall being lower than that of the second sidewall.

Selectively, an inner surface of the first sidewall of the LED lead frame is a sloped surface, which is facing toward the outside of the recess.

Selectively, the inner surface of the first sidewall, being the sloped surface, is a flat surface.

Selectively, an included angle between the bottom surface of the recess and the inner surface of the first sidewall is between 105 degrees to 165 degrees. Preferably, an included angle between the bottom surface of the recess and the inner surface of the first sidewall is between 120 degrees to 150 degrees.

Selectively, the inner surface of the first sidewall, being the sloped surface, is a curved surface.

Selectively, an LED light bar is directly contacting and disposed onto the inner wall of the lamp tube, in which the LED light sources are disposed on the LED light bar.

Selectively, a reflective film layer is disposed on an inner circumferential surface of the lamp tube and at two sides of the LED light bar extending along the circumferential direction of the lamp tube.

Selectively, the reflective film layer extending circumferentially along the length of the lamp tube occupies 30% to 50% of the inner circumferential surface area of the lamp tube.

Selectively, the LED light sources are more than one in quantity or number, arranged in one or more rows, in which each row of the LED light source is arranged along a length direction of the lamp tube.

Selectively, the lamp tube is a glass tube or a plastic tube.

According to still another embodiment, the present invention provides an end cap for the LED tube lamp having a lamp tube, the end cap comprising an electrically insulating tubular part, sleeved over outside of the end of the lamp tube, a magnetic metal member, fixedly-disposed an inner circumferential surface of the electrically insulating tubular part, an inner circumferential surface of the magnetic metal member is covered by a hot melt adhesive.

Selectively, the hot melt adhesive is completely covering the inner circumferential surface of the magnetic metal member.

Selectively, the magnetic metal member is ring-shaped.

Selectively, the magnetic metal member includes at least one opening.

Selectively, the at least one opening of the magnetic metal member preferably occupies 10% to 50% of the area of the magnetic metal member.

Selectively, the at least one opening are more than one in number or quantity, and are arranged circumferentially around the magnetic metal member in an equidistantly spaced manner.

Selectively, the at least one opening are more than one in number or quantity, and are arranged circumferentially around the magnetic metal member in an not equally spaced manner.

Selectively, the magnetic metal member has an embossed structure formed facing the surface of the electrically insulating tubular part of the end cap.

Selectively, the embossed structure of the magnetic metal member is protruding from the inner circumferential surface of the magnetic metal member toward the outer circumferential surface of the magnetic metal member.

Selectively, the embossed structure of the magnetic metal member is protruding from the outer circumferential surface of the magnetic metal member toward the inner circumferential surface of the magnetic metal member.

Selectively, the magnetic metal member and the electrically insulating tubular part are cylindrical and coaxial.

Selectively, the magnetic metal member is a circular ring or a non-circular ring.

Selectively, the magnetic metal member is an oval ring.

Selectively, the hot melt adhesive is directly mixed with a predetermined ratio of a magnetic object such as iron powder, nickel powder or iron-nickel powder (being made of iron, nickel, or iron-nickel alloy), and upon electrical conduction, the magnetic substance is evenly distributed within the hot melt adhesive and also electrical conducting, thereby heating up the hot melt adhesive, and upon expansion due to heat absorption, the hot melt adhesive flows, and then solidifies upon cooling, thereby bonding together the end cap to the lamp tube.

According to still another embodiment, the present invention provides an LED tube lamp, comprising a lamp tube, and any one of the above-mentioned end cap, in which the lamp tube includes a main region and a rear end region, the outer diameter of the rear end region is less than the outer diameter of the main region, and the rear end region of the lamp tube is sleeved with the end cap. Selectively, two end caps are provided, in which each end cap is equipped with one power supply. The sizes of the two end caps are different in some embodiments, and the size of one end cap is 30%-80% of the size of the other larger end cap in some other embodiments.

Some of the advantages, benefits or improvements upon the related art by the present invention, includes the following: (a) due to the adopting of the bendable circuit sheet for the LED light bar of embodiments of present invention, the bendable circuit sheet (the LED light bar) renders a ruptured or broken lamp tube to being not able (unable) to maintain a straight pipe or tube configuration so as to better inform the user that the LED tube lamp is deemed unusable so as to avoid potential electric shock accidents from occurring; (b) the bendable circuit sheet of present invention can be directly soldered to the output terminal of the power supply so as to prevent damages or breakages during shipping or transport of the LED tube lamp; (c) holes formed in the soldering pad of the bendable circuit sheet can facilitate direct heating using a thermo-compression head by applying heat on the front side of the bendable circuit sheet to soldering bond the soldering pad of the power supply located on the front surface; (d) electrically insulating hole can be formed and disposed between two soldering pads, for the sake of preventing accidental electrical short caused by adjacent solidifying solder portions from separate soldering pads that have inadvertently joined together; (e) In addition, an alignment hole can be configured and disposed behind the electrically insulating hole, which can be used for allowing the automated solder bonding equipment to accurately determine the correct location of the soldering pads; (f) the inner portion of the soldering pads can have a plurality of through holes, so that upon soldering, the tin solder can penetrate through the through holes of the soldering pad. Upon exiting the through holes, the tin solder can be accumulated surrounding the outer periphery of the opening of the through holes, so that upon cooling and solidifying, a plurality of solder balls are formed. The solder balls possess similar function as nails, so that apart from having the tin solder to secure the soldering pads, the solder balls further act to strengthen the electrical connection of the two pads; (g) alternatively, a notch can be formed in the soldering pad, and the soldered tin can pass through the notch to bond together the soldering pads, and the excess amount of the tin solder may be more easily undergo reflux or reflow downward to be solidified together with the solder on the soldering pad, as well as accumulating around periphery of the notch, and the resulting illustrated solder bonding structure has added electrical connection reliability; (h) In contrast to the solder bonding technique of having the output terminal pad a of the power supply being of different surface to one of the surfaces of the bendable circuit sheet that is mounted with the LED light source thereon, a downward tension is exerted on the power supply at the connection end of the power supply and the bendable circuit sheet, so that the bendable circuit sheet, with the through-hole configured soldering pads, form a stronger and more secure electrical connection between the bendable circuit sheet and the power supply.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
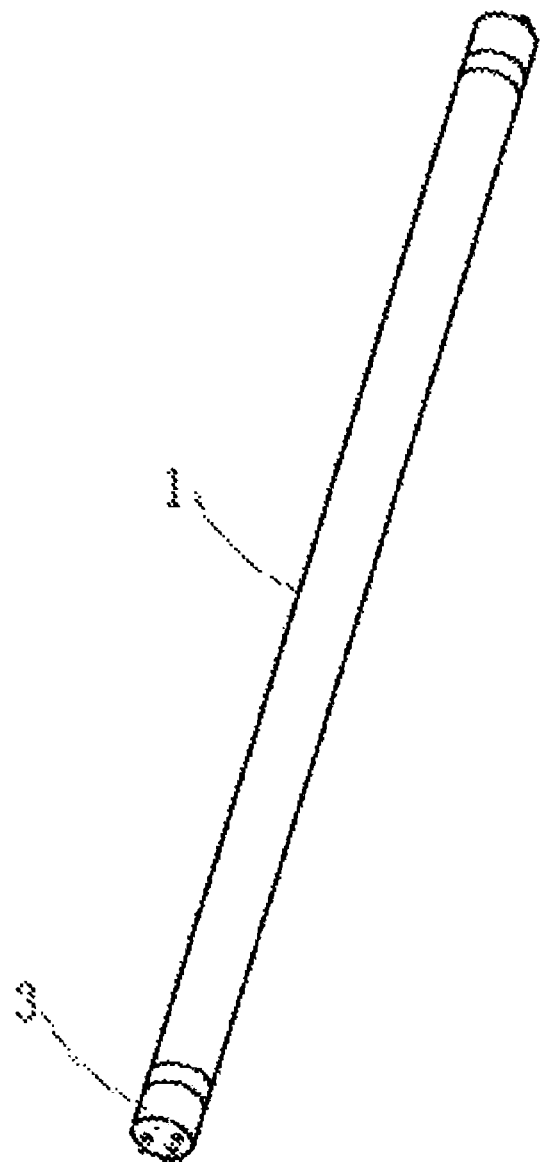
FIG. 1 is a perspective view of an LED tube lamp according to an embodiment of the present invention.
Figure 2:
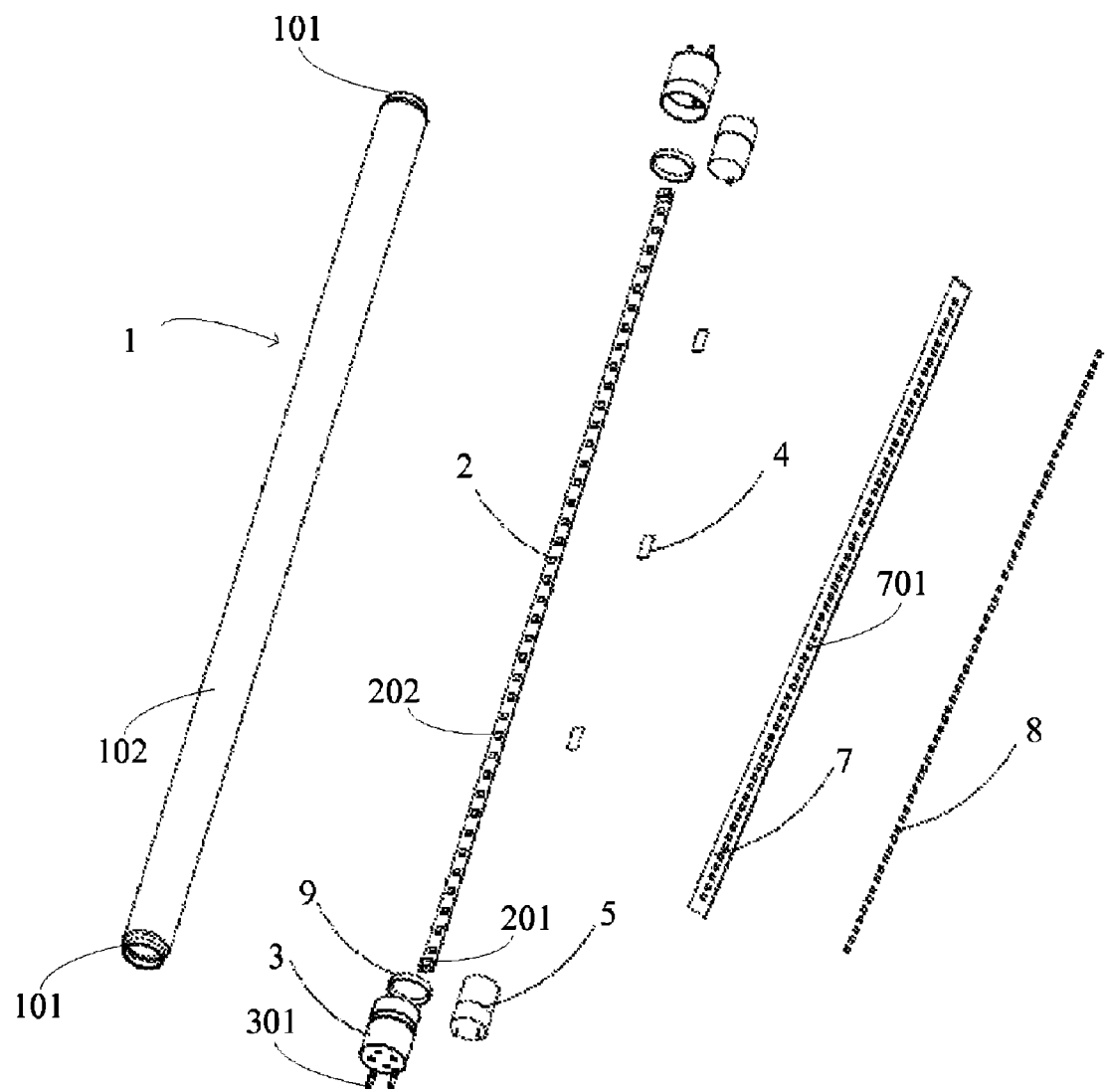
FIG. 2 is an exploded view of a disassembled LED tube lamp according to the embodiment of the present invention.

According to an embodiment of present invention, an LED tube lamp is shown in FIGS. 1 and 2, in which the LED tube lamp includes at least a lamp tube 1, an LED light bar 2, and two end caps 3. The LED light bar 2 is disposed inside the lamp tube 1 when assembled. The two end caps 3 are disposed at the two ends of the lamp tube, respectively. The sizes of the two end caps are different in some embodiments, and the size of one end cap is 30%-80% of the size of the other larger end cap in some other embodiments. The lamp tube 1 can be made of plastic or glass.

In the present embodiment, the lamp tube 1 is made of tempered glass. The method for strengthening or tempering of glass tube can be done by a chemical tempering method or a physical tempering method for further processing on the glass lamp tube 1. For example, the chemical tempering method is to use other alkali metal ions to exchange with the Na ions or K ions to be exchanged. Other alkali metal ions and the sodium (Na) ions or potassium (K) ions on the glass surface are exchanged, in which an ion exchange layer is formed on the glass surface. When cooled to room temperature, the glass is then under tension on the inside, while under compression on the outside thereof, so as to achieve the purpose of increased strength, including but not limited to the following glass tempering methods: high temperature type ion exchange method, the low temperature type ion exchange method, dealkalization, surface crystallization, sodium silicate strengthening method. High-temperature ion exchange method includes the following steps.

First, glass containing sodium oxide ($Na_2O$) or potassium oxide ($K_2O$) in the temperature range of the softening point and glass transition point are inserted into molten salt of lithium, so that the Na ions in the glass are exchanged for Li ions in the molten salt. Later, the glass is then cooled to room temperature, since the surface layer containing Li ions has different expansion coefficient with respect to the inner layer containing Na ions or K ions, thus the surface produces residual stress and is reinforced. Meanwhile, the glass containing $AL_2O_3$, $TiO_2$ and other components, by performing ion exchange, can produce glass crystals of extremely low coefficient of expansion. The crystallized glass surface after cooling produces significant amount of pressure, up to 700 MPa, which can enhance the strength of glass. Low-temperature ion exchange method includes the following steps: First, a monovalent cation (e.g., K ions) undergoes ion exchange with the alkali ions (e.g. Na ion) on the surface layer at a temperature range that is lower than the strain point temperature, so as to allow the K ions penetrating the surface. For example, for manufacturing a $Na_2O+CaO+SiO_2$ system glass, the glass can be impregnated for ten hours at more than four hundred degrees in the molten salt. The low temperature ion exchange method can easily obtain glass of higher strength, and the processing method is simple, does not damage the transparent nature of the glass surface, and not undergo shape distortion. Dealkalization includes of treating glass using platinum (Pt) catalyst along with sulfurous acid gas and water in a high temperature atmosphere. The Na+ ions are migrated out and bleed from the glass surface to be reacted with the Pt catalyst, so that whereby the surface layer becomes a $SiO_2$ enriched layer, which results in being a low expansion glass and produces compressive stress upon cooling. Surface crystallization method and the high temperature type ion exchange method are different, but only the surface layer is treated by heat treatment to form low expansion coefficient microcrystals on the glass surface, thus reinforcing the glass. Sodium silicate glass strengthening method is a tempering method using sodium silicate (water glass) in water solution at 100 degrees Celsius and several atmospheres of pressure treatment, where a stronger/higher strength glass surface that is harder to scratch is thereby produced. The above glass tempering methods described including physical tempering methods and chemical tempering methods, in which various combinations of different tempering methods can also be combined together.

Figure 3:
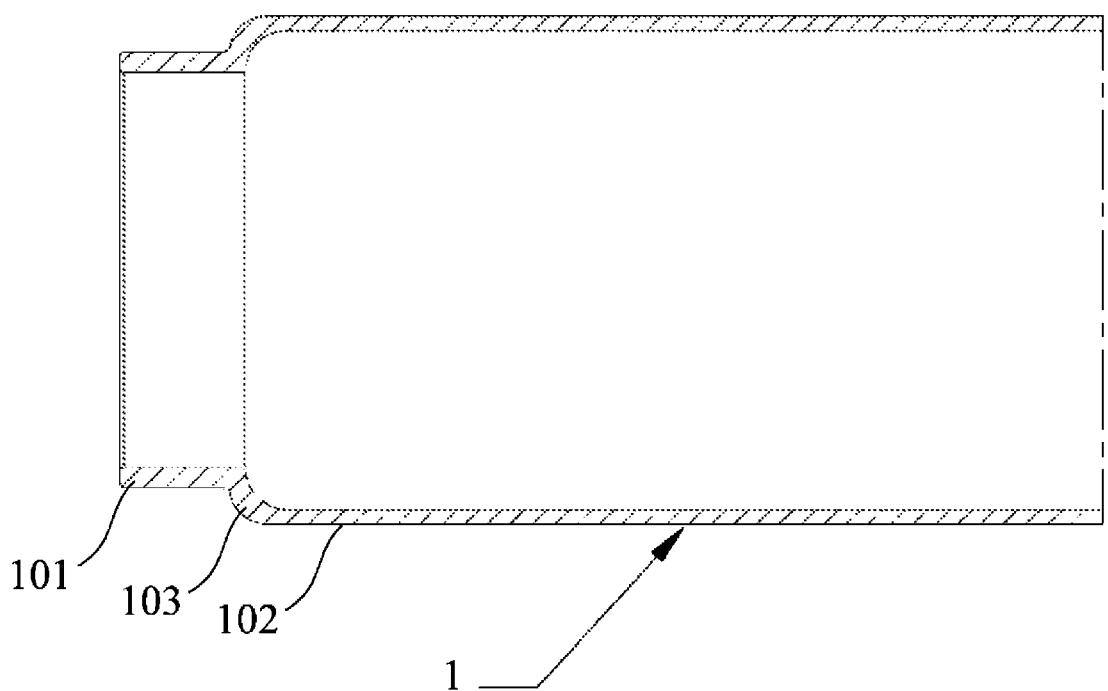
FIG. 3 is a cross-sectional partial view of one end region of a lamp tube of the LED tube lamp according to the embodiment of the present invention.

In the illustrated embodiment as shown in FIG. 3, the lamp tube 1 includes a main region 102, a plurality of rear end regions 101, and a plurality of transition regions 103. The lamp tube 1 is fabricated by undergoing a glass shaping process so as to form one or more narrowly curved end regions at one or more ends thereof, in which each narrowly curved end region includes one rear end region 101 and one transition region 103, from a cylindrical raw lamp tube. At the same time, the glass shaping process coincides to be substantially concurrently or is same as a glass toughening or tempering treatment process. In other words, while the lamp tube 1 is toughened or tempered, the narrowly curved end regions as shown in FIG. 3 are also shaped alongside at the same time. Each transition region 103 is located between an end of the main region 102 and one rear end region 101. The rear end region 101 is connected to one end of the transition region 103, and the other end of the transition region 103 is connected to one end of the main region 102.

Figure 7:
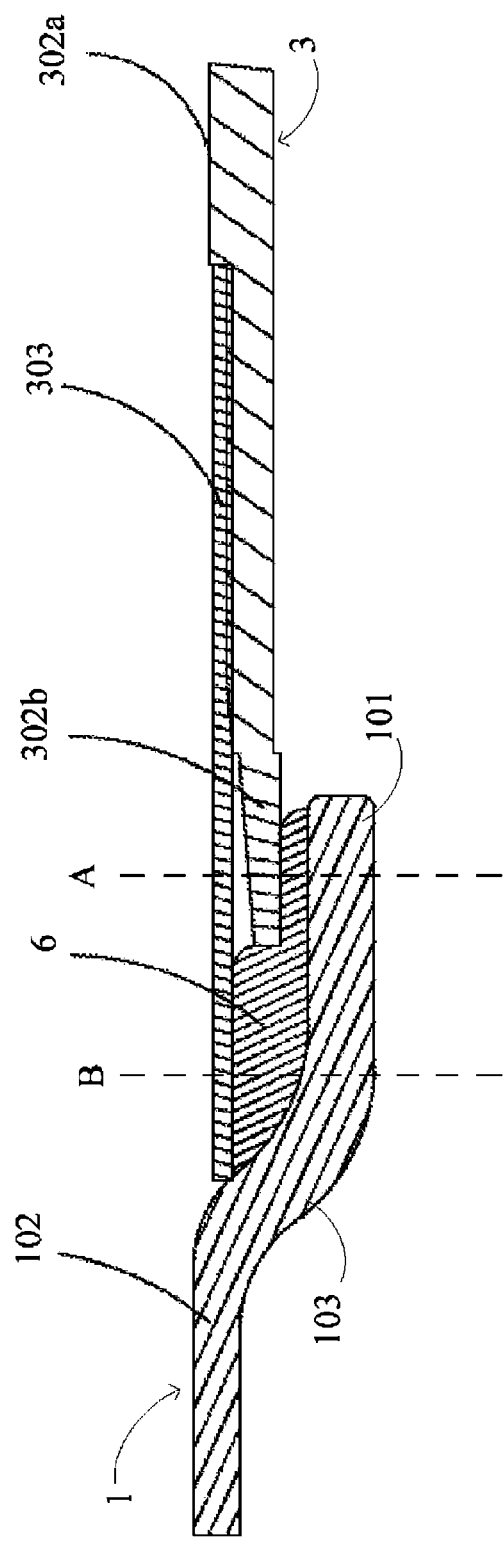
FIG. 7 is a cross-sectional partial view of a connecting or coupling region of the end cap and the lamp tube according to the embodiment of the present invention.
Figure 9:
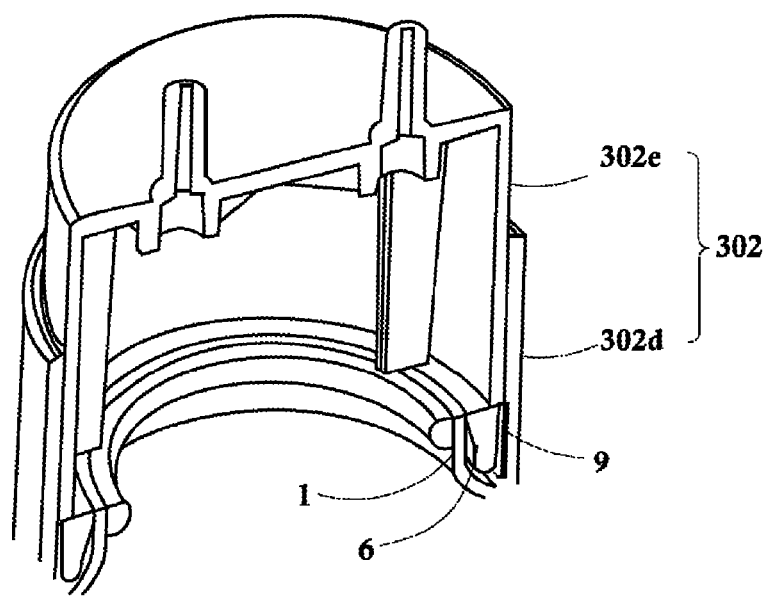
FIG. 9 is a partial perspective sectional view of the all-plastic end cap (containing a magnetic metal member and hot melt adhesive) of FIG. 8 showing internal structure thereof.

In the illustrated embodiment, the number of the rear end regions 101 and the number of the transition regions 103 are two, respectively. The transition region 103 is curved or arc-shaped at both ends thereof under cross-sectional view, that is to say, the curved ends of the transition regions 103 are seen along the axial direction of the lamp tube 1. As illustrated in FIGS. 7 and 9, one end cap 3 sleeves over the rear end region 101. The outer diameter of the rear end region 101 is less than the outer diameter of the main region 102. A cross section view of the rear end region 101 shows a flat surface, which is parallel with the main region 102. After undergone a glass toughening or tempering treatment process, the rear end regions 101 of the lamp tube 1 are formed to be a plurality of toughened glass structural portions. The end cap 3 is sleeved over the rear end region 101 (which is a toughened glass structural portion). The outer diameter of the end cap 3 is the same as the outer diameter of the main region 102 of the lamp tube 1.

Figure 4:
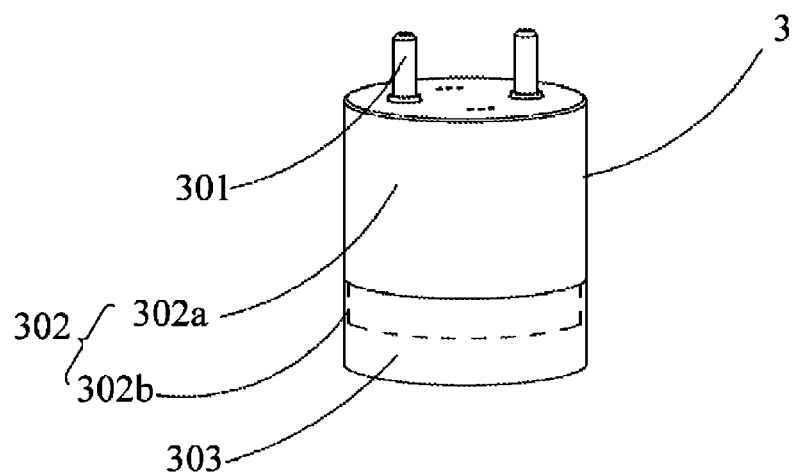
FIG. 4 is a frontal perspective schematic view of an end cap of the LED tube lamp according to the embodiment of the present invention.
Figure 5:
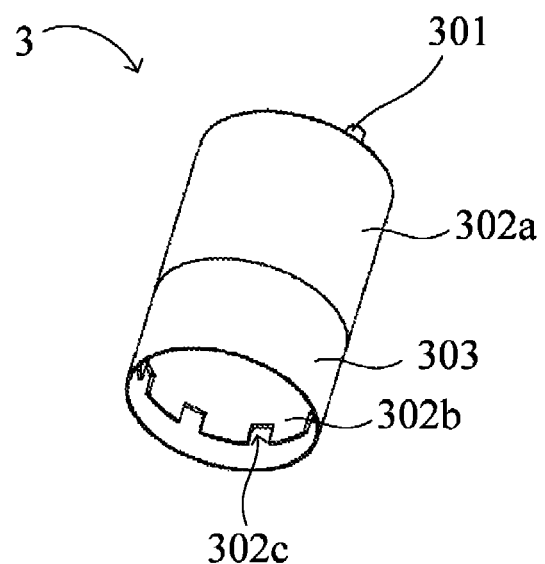
FIG. 5 is a bottom perspective view of the end cap of the LED tube lamp according to the embodiment of the present invention, showing the inside structure thereof.
Figure 6:
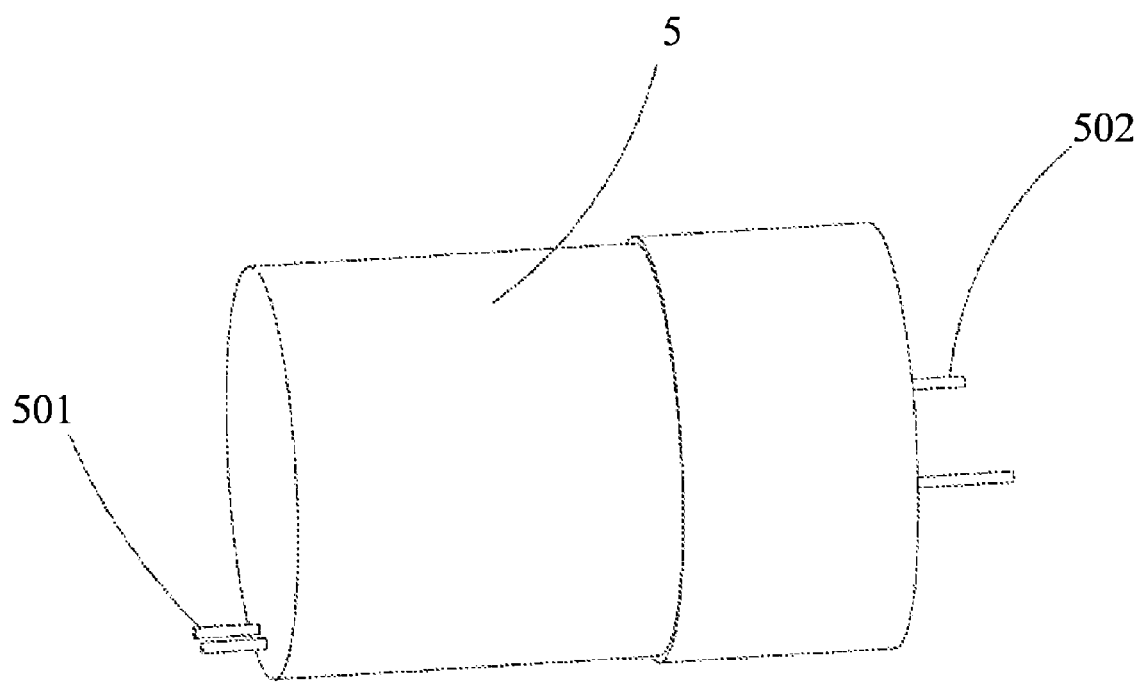
FIG. 6 is a side perspective view of a power supply of the LED tube lamp according to the embodiment of the present invention.

Referring to FIGS. 4 and 5, each end cap 3 includes a plurality of hollow conductive pins 301, an electrically insulating tubular part 302 and a thermal conductive ring 303. The thermal conductive ring 303 can be a metal ring that is tubular in shape. The thermal conductive ring 303 is sleeved over the electrically insulating tubular part 302. The hollow conductive pins 301 are disposed on the electrically insulating tubular part 302.

As shown in FIG. 7, one end of the thermal conductive ring 303 is protruded away from the electrically insulating tubular part 302 of the end cap 3 towards one end of the lamp tube 1, of which is bonded and adhered using a hot melt adhesive 6. As illustrated, the hot melt adhesive 6 forms a pool and then solidifies to fittingly join together the rear end region 101 and a portion of the transition region 103 of the lamp tube 1 to a portion of the thermal conductive ring 303 and a portion of the electrically insulating tubular part 302 of the end cap 3. As a result, the end cap 3 is then joined to one end of the lamp tube 1 using the hot melt adhesive 6. The thermal conductive ring 303 of the end cap 3 is extending to the transition region 103 of the lamp tube 1. The outer diameter of the thermal conductive ring 303 is substantially the same as the outer diameter of the main region 102 of the lamp tube 1, and the outer diameter of the thermal conductive ring 303 is also substantially the same as the outer diameter of the electrically insulating tubular part 302. The electrically insulating tubular part 302 facing toward the lamp tube 1 and the transition region 103 has a gap therebetween.

As a result, the LED tube lamp has a substantially uniform exterior diameter from end to end thereof. Because of the substantially uniform exterior diameter of the LED tube lamp, the LED tube lamp has a uniformly distributed stress point locations covering the entire span of the LED tube lamp (in contrast with conventional LED tube lamps which have different diameters between the end caps 3 and the lamp tube 1, and often utilizes packaging that only contacts the end caps 3 (of larger diameter), but not the lamp tube 1 of reduced diameter). In addition, the end cap 3 and the main region 102 does not form any gap therebetween. Therefore, the packaging design configured for shipping of the lamp tube 1 of the embodiment of present invention can include more evenly distributed contact stress points at many more locations covering the entire span of the LED tube lamp, up to contacting along the entire outer circumferential surface of the LED tube lamp 1.

In the present embodiment, the outer diameter of the end caps 3 are the same as the outer diameter of the main region 102, and the tolerance for the outer diameter measurements thereof are preferred to be within +/−0.2 millimeter (mm), and should not exceed +/−1.0 millimeter (mm). The outer diameter difference between the rear end region 101 and the main region 102 can be 1 mm to 10 mm for typical product applications. Meanwhile, for preferred embodiment, the outer diameter difference between the rear end region 101 and the main region 102 can be 2 mm to 7 mm. The length of the transition region 103 is from 1 mm to 4 mm. Upon experimentation, it was found that when the length of the transition region 103 is either less than 1 mm or more than 4 mm, problems would arise due to insufficient strength or reduction in light illumination surface of the lamp tube. In alternative embodiment, the transition region 103 can be without curve or arc in shape.

Figure 38:
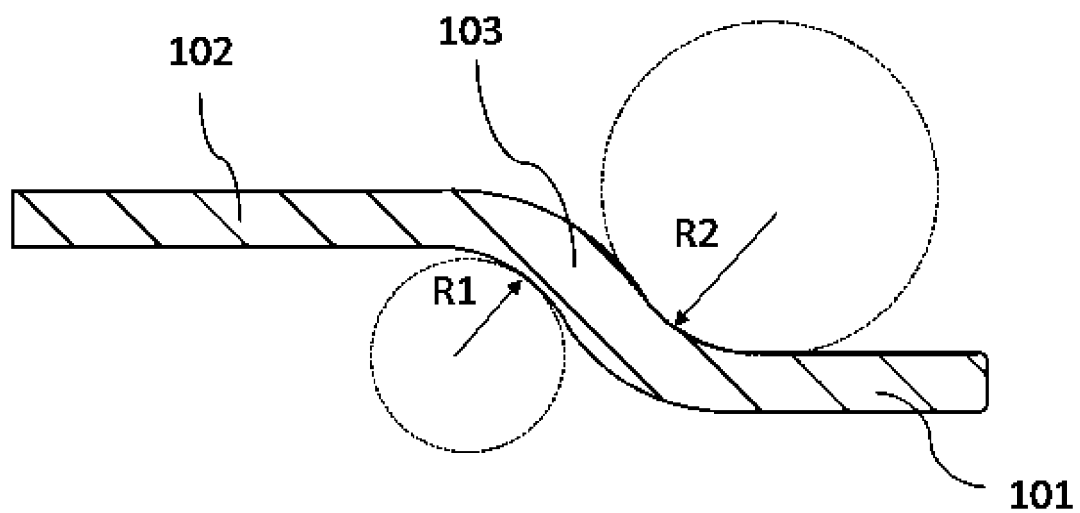
FIG. 38 shows an enlarged partial cross-sectional view of the lamp tube shown in FIG. 7 at the transition region thereof.

Referring to FIGS. 7 and 38, which show cross-sectional partial views of a connecting or coupling region of the end cap 3 and the lamp tube 1 of the LED tube lamp of the embodiment of the present invention, including an enlarged view at the transition region 103 of the lamp tube 1. In the illustrated embodiment, the lamp tube 1 is a glass tube, the transition region 103 disposed between the main region 102 and the rear end region 101 possesses two continuous curved portions or sections to respectively connect the main region 102 and the rear end region 101, in which one curved section has a radius of curvature R1, and the other curved section has a radius of curvature R2, and together the two curved sections form an inverted "S" shape. Typically speaking, the relationship between R1 and R2 are expressed as follow: R1 is less than R2 (R1<R2), the ratio of R1 to R2 can range from 1:1.5~1:10, with a preferred ratio of R1 to R2 ranging from 1:2.5~1:5, and an optimal ratio of R1 to R2 ranging from 1:3~1:4. In the illustrated embodiment, the ratio of R1 and R2 is about 1:3. As a result, the transition region 103 near the rear end region 101 (which is the curved section with the radius of curvature R2), would be under tension force on the inside, while under compression force on the outside, so as to achieve the object of strengthening or tempering thereof.

Upon adopting the T8 standard lamp format as an example, the outer diameter of the rear end region 101 is configured between 20.9 mm to 23 mm. Meanwhile, if the outer diameter of the rear end region 101 is less than 20.9 mm, the inner diameter of the rear end region 101 would be too small, thus rendering inability of the power supply to be fittingly inserted into the lamp tube 1. The outer diameter of the main region 102 is preferably configured to be between 25 mm to 28 mm.

Referring to FIG. 2, the LED light bar 2 of the embodiment of the present invention has a plurality of LED light sources 202 mounted thereon. The end cap 3 has a power supply 5 installed therein. The LED light sources 202 and the power supply 5 are electrically connected by the LED light bar 2. The power supply 5 may be in the form of a single individual unit (i.e., all of the power supply components are integrated into one module unit), and to be installed in one end cap 3. Alternatively, the power supply 5 may be divided into two separate units (i.e. all of the power supply components are divided into two parts) which are installed at the end caps 3, respectively. The number of units of the power supply 5 is corresponding to the number of the ends of the lamp tube 1 which had undergone glass tempering and strengthening process. In addition, the location of the power supply is also corresponding to the location of the lamp tube 1 which had undergone glass tempering. The power supply can be fabricated by encapsulation molding by using a high thermal conductivity silica gel (with thermal conductivity ≥0.7 w/m·k), or fabricated in the form of exposed power supply electronic components that are packaged by conventional heat shrink sleeved to be placed into the end cap 3.

Referring to FIG. 2 and FIGS. 4-6, the power supply 5 includes a male plug 501 and a metal pin 502. The male plug 501 and the metal pin 502 are located at opposite ends of the power supply 5. The LED light bar 2 is configured with a female plug 201 at an end thereof. The end cap 3 is configured with a hollow conductive pin 301 used for coupling with an external power source. The male plugs 501 of the power supply 5 are fittingly engaged into the female plug 201 of the LED light bar 2, while the metal pins 502 of the power supply 5 are fittingly engaged into the hollow conductive pins 301 of the end cap 3. Upon inserting the metal pin 502 into the hollow conductive pin 301, a punching action is provided against the hollow conductive pin 31 using an external punching tool to create a slight amount of shape deformation of the hollow conductive pin 301, thereby securing and fixing the metal pin 502 of the power supply 5.

Upon being energized or powered on, the electrical current passes through the hollow conductive pin 301, the metal pin 502, the male plug 501, and the female plug 201, to reach the LED light bar 2, and through the LED light bar 2 to reach the LED light sources 202. In other embodiments, the male plug 501 and the female plug 502 may not be employed, and conventional wire bonding techniques can be adopted for replacement. In alternative embodiment, the power supply 5 can be mounted on a printed circuit board (not shown), and the connection technique using the male plug 501 and the female plug 201 or alternatively, the wire bonding technique can be utilized to electrically connect the LED light bar 2 to the power supply 5. Meanwhile, the device structure of the power supply 5 is not limited to that shown in FIG. 6.

Referring to FIGS. 4-5 and FIGS. 7-9, the end cap 3 is sleeved over the lamp tube 1. To be more specific, the end cap 3 is sleeved over the rear end region 101 and extending toward the transition region 103 so as to be partially overlapping with the transition region 103. In the present embodiment, the thermal conductive ring 303 of the end cap 3 is extended to reach the transition region 103 of the lamp tube 1, so that by means of the intimate or direct physical contact between the thermal conductive ring 303 and the transition region 103, the thermal conductive ring 303 and the lamp tube 1 via adhesive bonding using the hot melt adhesive 6, thereby would not cause any spillover or overflow of any hot melt adhesive 6 from the end cap 3 to remain hanging onto surface of the main region 102, meanwhile an end of the electrically insulating tubular part 302 facing the lamp tube 1 is not extended to reach the transition region 103, that is to say, the end of the electrically insulating tubular part 302 facing the lamp tube 1 and the transition region 103 has a gap therebetween. In addition, the electrically insulating tubular part 302 is made of a material that is not a good electrical conductor, but is not limited to being plastic or ceramic materials.

The hot melt adhesive 6 (includes a so-called commonly known as "weld mud powder") includes phenolic resin 2127, shellac, rosin, calcium carbonate powder, zinc oxide, and ethanol, etc. In the illustrated embodiment, rosin acts as a thickening agent that possesses the physical property of dissolving in ethanol but not in water. The lamp tube 1 at the rear end region 101 and the transition region 103 (as shown in FIG. 7) is coated by the hot melt adhesive, which when undergone heating, would be greatly expanded, so as to allow tighter and closer contact between the end cap 3 and the lamp tube 1, thus allowing for realization of manufacturing automation for LED tube lamp. Furthermore, the hot melt adhesive 6 would not be afraid of decreased reliability when operating under elevated temperature conditions by the power supply and other heat generating components. In addition, the hot melt adhesive 6 can prevent the deterioration of bonding strength over time between the lamp tube 1 and the end cap 3, thereby improving long term reliability.

Specifically, the hot melt adhesive 6 is contained in between an inner circumferential surface portion of the extending portion of the thermal conductive ring 303 and the outer circumferential surface of the lamp tube 1 at the rear end region 101 and the transition region 103 (location is shown in a broken/dashed line identified as "B" in FIG. 7, also referred to as "a first location"). The coating thickness of the hot melt adhesive 6 can be 0.2 mm to 0.5 mm. After curing, the hot melt adhesive 6 expands and contacts with the lamp tube 1, thus fixing the end cap 3 to the lamp tube 1. Thus, upon filling and curing of the hot melt adhesive 6, the thermal conductive ring 303 is bonded or fixedly arranged to an outer (circumferential) surface of the lamp tube 1 by the hot melt adhesive 6 therebetween at the dashed line B in FIG. 7, which can also be referred to as the first location herein. Due to the difference in height between the outer circumferential surface of the rear end region 101 and the outer circumferential surface of the main region 102, thus avoiding overflow or spillover of the hot melt adhesive 6 to the main region 102 of the lamp tube 1, forsaking or avoiding having to perform manual adhesive wipe off or clean off, thus improving LED tube lamp production efficiency.

Meanwhile, likewise for the embodiment shown in FIG. 9, a magnetic metal member 9 is fixedly arranged or disposed on an inner circumferential surface of the electrically insulating tubular part 302, and bonded to an outer circumferential surface of the lamp tube 1 using the hot melt adhesive 6, in which the hot melt adhesive 6 does not spillover through the gap between the end cap and one of the transition regions 103 during the filling process of the hot melt adhesive 6. During fabrication process of the LED tube lamp, a heat generating equipment is used to heat up the thermal conductive ring 303, and also heat up the hot melt adhesive 6, to thereby melt and expand thereof to securely attach and bond the end cap 3 to the lamp tube 1.

In the present embodiment, the electrically insulating tubular part 302 of the end cap 3 includes a first tubular part 302a and a second tubular part 302b. The first tubular part 302a and the second tubular part 302b are connected along an axis of extension of the electrically insulating tubular part 302 or an axial direction of the lamp tube 1. The outer diameter of the second tubular part 302b is less than the outer diameter of the first tubular part 302a. The outer diameter difference between the first tubular part 302a and the second tubular part 302b is between 0.15 mm to 0.30 mm. The thermal conductive ring 303 is fixedly configured over and surrounding the outer circumferential surface of the second tubular part 302b. The outer circumferential surface of the thermal conductive ring 303 is coplanar or substantially flush with respect to the outer circumferential surface of the first tubular part 302a, in other words, the thermal conductive ring 303 and the first tubular part 302a have substantially uniform exterior diameters from end to end. As a result, the end cap 3 achieves an outer appearance of smooth and substantially uniform tubular structure.

In the embodiment, a ratio of the length of the thermal conductive ring 303 along the axial direction of the end cap 3 with respect to the axial length of the electrically insulating tubular part 302 ranges from 1:2.5 to 1:5. In the present embodiment, the inner circumferential surface of the second tubular part 302b and the inner circumferential surface of the thermal conductive ring 303, the outer circumferential surface of the rear end region 101 and the outer circumferential surface of the transition region 103 together form an accommodation space. In order to ensure bonding longevity using the hot melt adhesive 6, in the present embodiment, the second tubular part 302b is at least partially disposed around the lamp tube 1, the hot melt adhesive 6 is at least partially contained in an overlapped region (shown by a broken/dashed line identified as "A" in FIG. 7, also referred herein as "a second location") between the inner circumferential surface of the second tubular part 302b and the outer circumferential surface of the rear end region 101 of the lamp tube 1, in which the second tubular part 302b and the rear end region 101 of the lamp tube 1 are bonded by the hot melt adhesive 6 disposed therebetween.

During manufacturing of the LED tube lamp, when the hot melt adhesive 6 is coated and applied between the thermal conductive ring 303 and the rear end region 101, it may be appropriate to increase the amount of hot melt adhesive 6 used, such that in the subsequent heating process, the hot melt adhesive 6 can be caused to expand and flow in between the second tubular part 302b and the rear end region 101, to thereby adhesively bond the second tubular part 302b and the rear end region 101. However, in the present embodiment, the hot melt adhesive 6 does not need to completely fill the entire accommodation space (as shown in the illustrated embodiment of FIG. 7), in which a gap is reserved or formed between the thermal conductive ring 303 and the second tubular part 302b. Thus, the hot melt adhesive 6 can be only partially filing the accommodation space.

During fabrication of the LED tube lamp, the rear end region 101 of the lamp tube 1 is inserted into one end of the end cap 3, the axial length of the portion of the rear end region 101 of the lamp tube 1 which had been inserted into the end cap 3 accounts for one-third (⅓) to two-thirds (⅔) of the total length of the thermal conductive ring 303 in an axial direction thereof. One benefit is that, the hollow conductive pins 301 and the thermal conductive ring 303 have sufficient creepage distance therebetween, and thus is not easy to form a short circuit leading to dangerous electric shock to individuals. On the other hand, due to the electrically insulating effect of the electrically insulating tubular part 302, thus the creepage distance between the hollow conductive pin 301 and the thermal conductive ring 303 is increased, and thus more easily to pass the test of people to obtain electric shock caused by operating under high voltage conditions.

In this embodiment, the electrically insulating tube 302 in general state, is not a good conductor of electricity and/or is not used for conducting purposes, but not limited to the use made of plastics, ceramics and other materials. Furthermore, for the hot melt adhesive 6 disposed in the inner circumferential surface of the second tubular part 302b, due to presence of the second tubular part 302b interposed between the hot melt adhesive 6 and the thermal conductive ring 303, therefore the heat conducted from the thermal conductive ring 303 to the hot melt adhesive 6 may be reduced. Thus, referring to FIG. 5, in this another embodiment, the end of the second tubular part 302b facing the lamp tube 1 (i.e., away from the first tubular part 302a) is provided a plurality of notches 302c, configured for increasing the contact area of the thermal conductive ring 303 and the hot melt adhesive 6, in order to be more conducive to provide rapid heat conduction from the thermal conductive ring 303 to the hot melt adhesive 6, so as to accelerate the curing of the hot melt adhesive 6. The notches 302c are spatially arranged along a circumferential direction of the second tubular part 302b. Meanwhile, when the user touches the thermal conductive ring 303, due to the electrical insulation property of the hot melt adhesive 6 located between the thermal conductive ring 303 and the lamp tube 1, no electrical shock would likely be produced by touching damaged portion of the lamp tube 1.

The thermal conductive ring 303 can be made of various heat conducting materials, the thermal conductive ring 303 of the present embodiment is a metal sheet, such as aluminum alloy. The thermal conductive ring 303 being tubular or ring shaped is sleeved over the second tubular part 302b. The electrically insulating tubular part 302 may be made of electrically insulating material, but would have low thermal conductivity so as to prevent the heat conduction to reach the power supply components located inside the end cap 3, which then negatively affect performance of the power supply components. In this embodiment, the electrically insulating tubular part 302 is a plastic tube. In other embodiments, the thermal conductive ring 303 may also be formed by a plurality of metal plates arranged along a plurality of second tubular part 302b in either circumferentially-spaced or not circumferentially-spaced arrangement. In other embodiments, the end cap may take on or have other structures.

Figure 8:
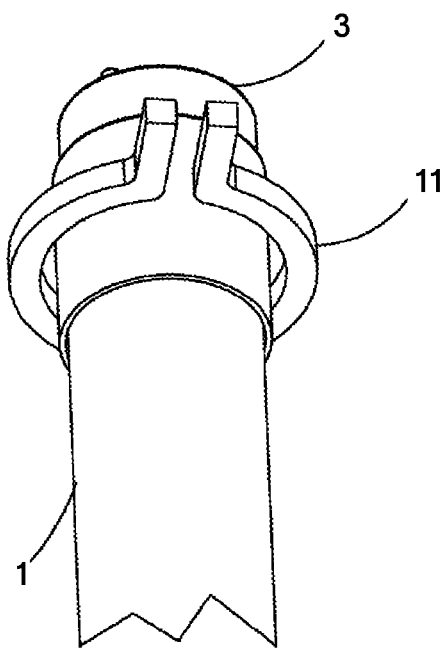
FIG. 8 is perspective illustrative schematic partial view of an all-plastic end cap (containing a magnetic metal member and hot melt adhesive) and the lamp tube being bonded together by an induction coil heat curing process according to another embodiment of the present invention.

Referring to FIGS. 8-9, the end cap 3 according to another embodiment includes a magnetic object being of a magnetic metal member 9 and an electrically insulating tubular part 302, rather than a thermal conductive ring. The magnetic metal member 9 is fixedly arranged on the inner circumferential surface of the electrically insulating tubular part 302, and has overlapping portions with respect to the lamp tube 1 in the radial direction. The hot melt adhesive 6 is coated on the inner circumferential surface of the magnetic metal member 9 (the surface of the magnetic metal tube member 9 facing the lamp tube 1), and bonding with the outer circumferential surface of the lamp tube 1. In order to increase the adhesion area, and to improve the stability of the adhesion, the hot melt adhesive 6 can cover the entire inner circumferential surface of the magnetic metal member 9. When manufacturing the LED tube lamp of the another embodiment, the electrically insulating tubular part 302 is inserted in an induction coil 11, so that the induction coil 11 and the magnetic metal member 9 are disposed opposite (or adjacent) to one another along the radial extending direction of the electrically insulating tubular part 302.

A method for bonding the end cap 3 and the lamp tube 1 with the magnetic metal member 9 according to another embodiment includes the following steps. The induction coil 11 is energized. After the induction coil 11 is energized, the induction coil 11 forms an electromagnetic field, and the electromagnetic field upon contacting the magnetic metal member 9 then transform into an electrical current, so that the magnetic metal member 9 becomes heated. Then, the heat from the magnetic metal member 9 is transferred to the hot melt adhesive 6, thus curing the hot melt adhesive 6 so as to bond the end cap 3 with the lamp tube 1. The induction coil 11 and the electrically insulating tubular part 302 are coaxially aligned, so that the energy transfer is more uniform. In this embodiment, a deviation value between the axes of the induction coil 11 and the electrically insulating tubular part 302 is not more than 0.05 mm. When the bonding process is complete, the induction coil 11 is removed away from the lamp tube 1. Upon completion of the fabrication process of the lamp tube 1, the induction coil 11 remains stationary at the same location, and the lamp tube 1 is detached away from the induction coil 11. In an alternative embodiment, the lamp tube 1 can remain stationary while the induction coil 11 is detached away from the lamp tube 1.

In the present embodiment, a heat curing equipment (not shown) can have a plurality of induction coils (not shown), that is to say, a plurality of lamp tubes (not shown) can be placed in a default location, so that the plurality of induction coils of the heat curing equipment can be movably configured and positioned into appropriate heat curing configuration similar to that as shown in FIG. 8. After heat curing is completed, the plurality of induction coils can be detached away from the lamp tubes. It is worth mentioning that, the induction coil 11, as shown in FIG. 8, also can use a top and a bottom semicircular jig to form a shape and structure similar to the induction coil 11 as shown, without necessarily requiring to have to use the same illustrated-ring shaped coil structure, will nevertheless achieve the same effect.

The electrically insulating tubular part 302 is further divide into two portions, namely a first tubular part 302d and a second tubular part 302e. In order to provide better support of the magnetic metal member 9, an inner diameter of the first tubular part 302d at the inner circumferential surface of the electrically insulating tubular part 302, for supporting the magnetic metal member 9, is larger than the inside diameter of the second tubular part 302e, and a stepped structure is formed by the electrically insulating tubular part 302 and the second tubular part 302e, where an end of the magnetic metal member 9 as viewed in an axial direction is abutted against the stepped structure. An inside diameter of the magnetic metal member 9 is larger than an outer diameter of the end (which is the rear end region 101) of the lamp tube 2. Upon installation of the magnetic metal member 9, the entire inner circumferential surface of the end cap 3 is maintained flush. Additionally, the magnetic metal member 9 may be of various shapes, e.g., a sheet-like or tubular-like structures being circumferentially arranged or the like, where the magnetic metal member 9 is coaxially arranged with the electrically insulating tubular part 302.

In other embodiments, the manufacturing process for bonding the end cap 3 and the lamp tube 1 can be achieved without the magnetic metal member 9. The magnetic substance such as iron powder, nickel powder or iron-nickel powder (being made of iron, nickel, or iron-nickel alloy) is directly mixed in the hot melt adhesive 6, or that highly magnetic powder material can replace a portion of the calcium carbonate powder, to a ratio of about 1:3~1:1 in volume between the highly magnetic powder material and the calcium carbonate powder. As a result, the end cap 3 when attached to the lamp tube 1 using the hot melt adhesive 6 can pass the quality testing (including destructive testing) of the end cap, so as to comply with the torque test quality standard and the bending moment quality standard at the same time. Typically, bending moment quality standard for the tube lamp is required to be larger than 5 Nt-m. In addition, the torque test quality standard is required to be larger than 1.5 Nt-m (Newton-meter). In the present embodiment, the hot melt adhesive 6 is blended with a predetermined highly magnetic powder material composition to endure 5 Nt-m~10 Nt-m for bending moment test results, and 1.5 Nt-m~5 Nt-m for torque test results. When manufacturing the LED tube lamp 1 of this embodiment, the hot melt adhesive 6 is contained between the inner circumferential surface of the electrically insulating tubular part 32 of the end cap 3 and the end of the lamp tube 1. After the induction coil 11 is energized, the induction coil 11 forms an electromagnetic field, and the charged particles of the magnetic object become heated. Then, the heat generated from the charged particles of the magnetic object is transferred to the hot melt adhesive 6, thus curing the hot melt adhesive 6 so as to bond the end cap 3 with the lamp tube 1.

In other embodiments, the end cap 3 can also be made of all-metal, which requires further providing an electrically insulating member beneath the hollow conductive pins as safety feature for accommodating high voltage usage.

Figure 12:
FIG. 12 is a schematic diagram showing the structure of the magnetic metal member including at least one hole, upon flattening out the magnetic metal member to be extending in a horizontal plane according to the embodiment of the present invention.

In other embodiments, the magnetic metal member 9 can have at least one opening 901 as shown in FIG. 12, in which the openings 901 can be circular, but not limited to being circular in shape, such as, for example, oval, square, star shaped, etc., as long as being possible to reduce the contact area between the magnetic metal member 9 and the inner circumferential surface of the electrically insulating tubular part 302, but while maintaining the function of melting and curing the hot melt adhesive 6. Preferably, the openings 901 occupy 10% to 50% of the area of the magnetic metal member 9. The opening 901 can be arranged circumferentially around the magnetic metal member 9 in an equidistantly spaced or not equally spaced manner.

Figure 13:
FIG. 13 is a schematic diagram showing the structure of the magnetic metal member including at least one embossed structure, upon flattening out the magnetic metal member to be extending in a horizontal plane according to the embodiment of the present invention.
Figure 15:
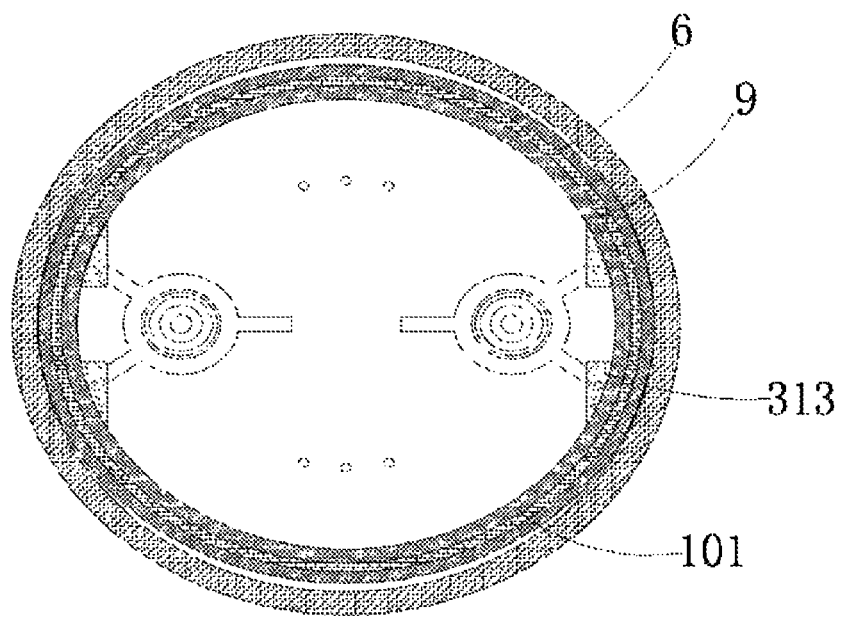
FIG. 15 is a top cross-sectional view of the end cap according to another embodiment of the present invention, showing an electrically insulating tubular part in an elliptical or oval shape extending along a radial axis of the lamp tube which also has a corresponding elliptical or oval shape.

In other embodiments, the magnetic metal member 9 has an indentation/embossed structure 903 as shown in FIG. 13, in which the embossed structure 903 are formed to be protruding from the inner circumferential surface of the magnetic metal member 9 toward the outer circumferential surface of the magnetic metal member 9, or vice versa, so long as the contact area between the inner circumferential surface of the electrically insulating tubular part 302 and the outer circumferential surface of the magnetic metal member 9 is reduced, but can sustain the function of melting and curing the hot melt adhesive 6. In other embodiments, the magnetic metal member 9 is a non-circular ring, such as, but not limited to an oval ring as shown in FIG. 15. When the lamp tube 1 and the end cap 3 are both circular, the minor axis of the oval ring shape is slightly larger than the outer diameter of the end region of the lamp tube 1, so long as the contact area of the inner circumferential surface of the electrically insulating tubular part 302 and the outer circumferential surface of the magnetic metal member 9 is reduced, but can achieve or maintain the function of melting and curing the hot melt adhesive 6. When the lamp tube 1 and the end cap 3 is circular, non-circular rings can reduce the contact area between the magnetic metal member 9 and the inner circumferential surface of the electrically insulating tubular part, but still can maintain the function of melting and curing the hot melt adhesive 6. In other words, the inner circumferential surface of the electrically insulating tubular part 302 includes a supporting portion 313, which supports the (non-circular shaped) magnetic metal member 9, so that the contact area between the magnetic metal member 9 and the inner circumferential surface of the electrically insulating tubular part 302 is reduced, but still achieve the melting and curing of the hot melt adhesive 6.

Figure 10:
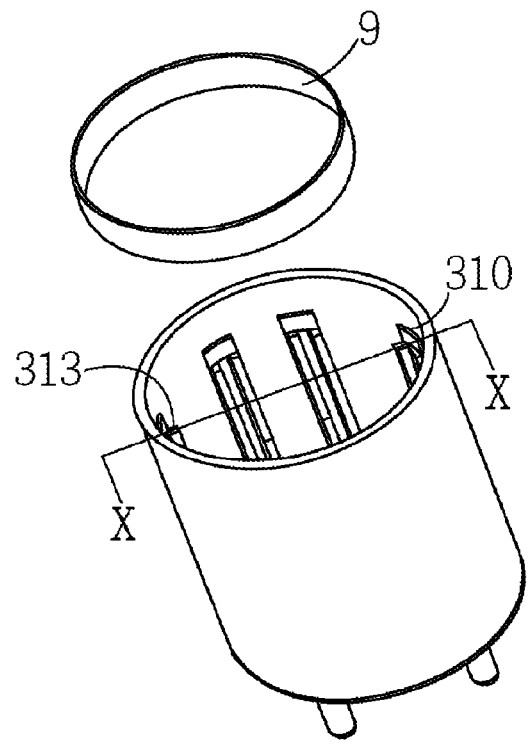
FIG. 10 is an exploded partial perspective view of the electrically insulating tubular part of the end cap according to another embodiment of the present invention, showing a supporting portion and a protruding portion disposed on the inner circumferential surface thereof.
Figure 11:
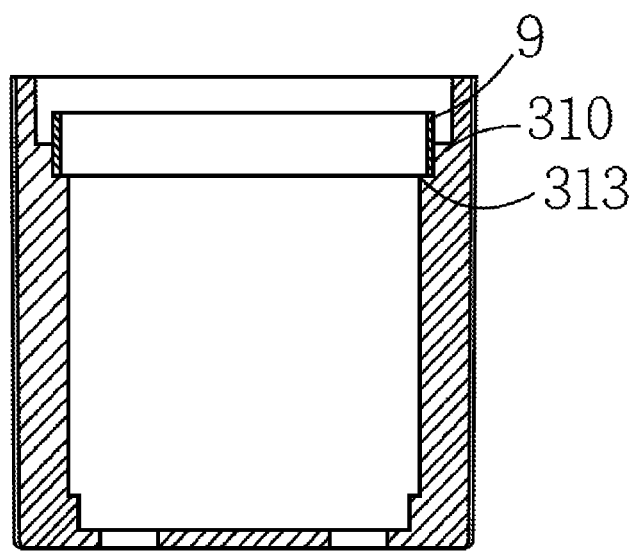
FIG. 11 is a cross-sectional view of the electrically insulating tubular part and the magnetic metal member of the end cap of FIG. 10 taken along a line X-X.
Figure 14:
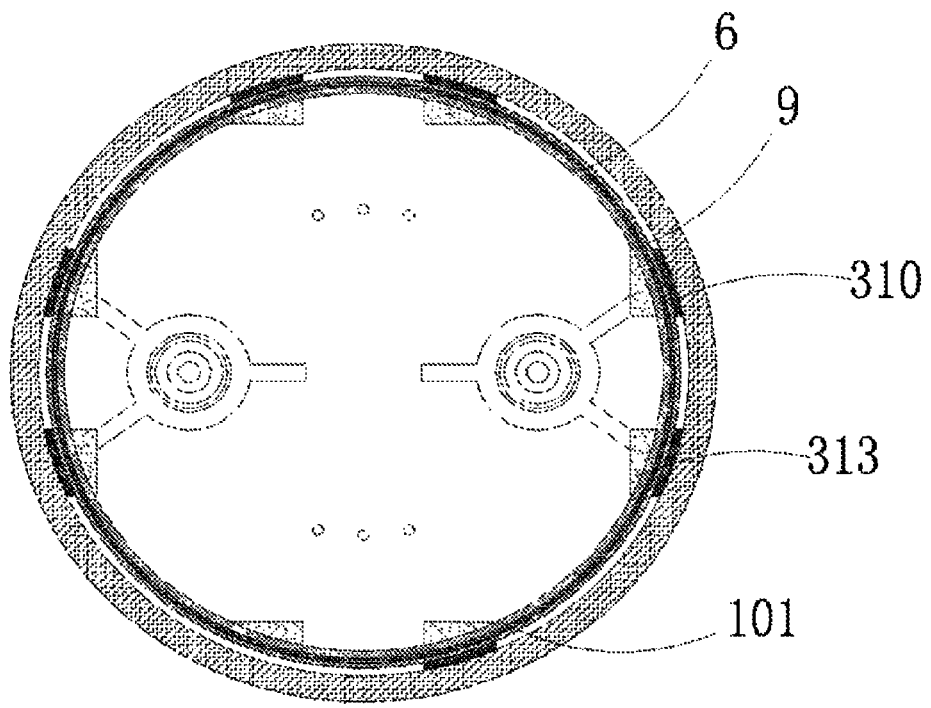
FIG. 14 is a top sectional view of the end cap shown in FIG. 10, showing the electrically insulating tubular part and the lamp tube extending along a radial axis of the lamp tube according to the embodiment of the present invention.

In other embodiments, the inner circumferential surface of the electrically insulating tubular part 302 has a plurality of supporting portions 313 and a plurality of protruding portions 310, as shown in FIGS. 10-11, and 14, in which the thickness of the protruding portion 310 is smaller than the thickness of the supporting portion 313. A stepped structure is formed at an upper edge of the supporting portion 313, in which the magnetic metal member 9 is abutted against the upper edges of the supporting portions 313, so that the magnetic metal member 9 can be then securely or firmly mounted within the electrically insulating tubular part 302. At least a portion of the protruding portion 310 is positioned between the inner circumferential surface of the electrically insulating tubular part 302 and the magnetic metal member 9. The arrangement or configuration of the protruding portions 310 may be arranged in a ring configuration in the circumferential direction along the inner circumferential surface of the electrically insulating tubular part 302 at equidistantly spaced or non-equidistantly spaced distances, the contact area of the inner circumferential surface of the electrically insulating tubular part 302 and the outer circumferential surface of the magnetic metal member 9 is reduced, but can achieve or maintain the function of melting and curing the hot melt adhesive 6. The protruding thickness of the supporting portion 313 toward the interior of the electrically insulating tubular part 302 is between 1 mm to 2 mm. The thickness of the protruding portion 310 of the electrically insulating tubular part 302 that is disposed on the inner circumferential surface of the electrically insulating tubular part 302 is less than the thickness of the supporting portion 313, and the thickness of the protruding portion 310 is between 0.2 mm to 1 mm.

Referring again to FIG. 2, the LED tube lamp according to the embodiment of present invention also includes an adhesive film 4, an electrical insulation adhesive film 7, and an optical adhesive film 8.

The LED light bar 2 is bonded onto the inner circumferential surface of the lamp tube 1 by using the adhesive film 4. In the illustrated embodiment, the adhesive film 4 may be silicone adhesive, but is not limited thereto. The electrical insulation adhesive film 7 is coated on the surface of the LED light bar 2 facing the LED light sources 202, so that the LED light bar 2 is not exposed, thus electrically insulating the LED light bar 2 and the outside environment. During application of the electrical insulation adhesive film 7, a plurality of through holes 701 are reserved and set aside corresponding to the positions/locations of the LED light sources 202. The LED light sources 202 are mounted in the through holes 701. The material composition of the electrical insulation adhesive film 7 comprises vinyl silicone, hydrogen polysiloxane and aluminum oxide. The electrical insulation adhesive film 7 has a thickness range of 100 μm to 140 μm (microns). If less than 100 μm in thickness, the electrical insulation adhesive film 7 will not achieve sufficient electrically insulating effect, but if more than 140 μm in thickness, the excessive electrical insulation adhesive will result in material waste. An optical adhesive film 8 is applied or coated on the surface of the LED light source 202. The optical adhesive film 8 is a clear or transparent material, in order to ensure optimal light transmission rate. After providing coating application to the LED light sources 202, the shape or structure of the optical adhesive film 8 may be in the form of a particulate gel or granular, a strip or a sheet. A preferred range for the refractive index of the optical adhesive film 8 is between 1.22 and 1.6. Another embodiment of the optical adhesive film 8 can have a refractive index value that is equal to a square root of the refractive index of the housing or casing of the LED light source 202, or equal to plus or minus 15% of the square root of the refractive index of the housing or casing of the LED light source 202, so as to achieve better light transmittance.

Figure 23:
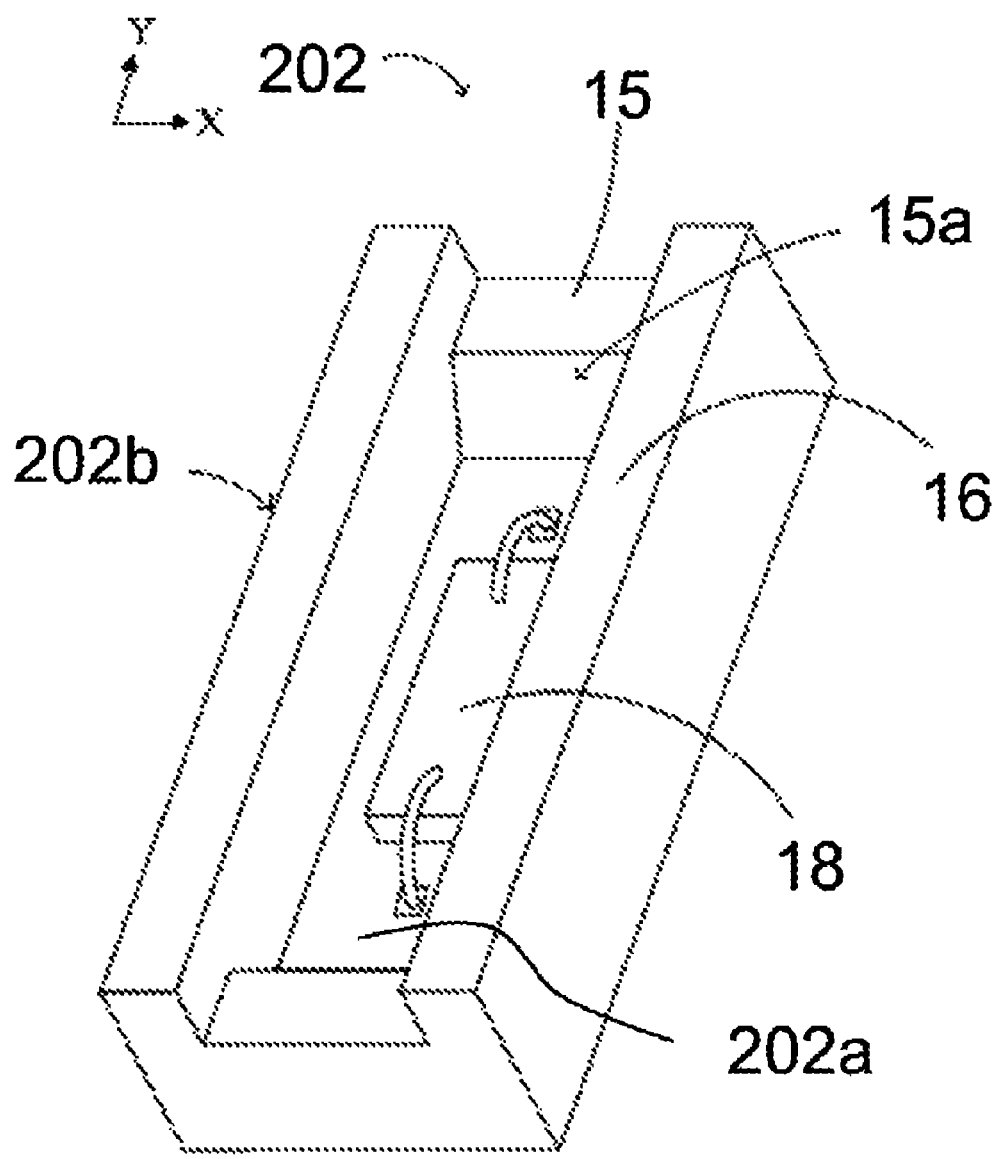
FIG. 23 is a perspective view of an LED lead frame for the LED light sources of the LED tube lamp of the embodiment of the present invention.

The housing/casing of the LED light sources 202 is a housing structure to accommodate and carry the LED dies (or chips) such as a LED lead frame 202b as shown in FIG. 23. The refractive index range of the optical adhesive film 8 in this embodiment ranges from 1.225 to 1.253. The thickness of the optical adhesive 8 can be in the range of 1.1 mm to 1.3 mm. When assembling the LED light sources to the LED light bar, the optical adhesive film 8 is applied on the LED light sources 202; then the electrical insulation adhesive film 7 is coated on one side of the LED light bar 2. Then the LED light sources 202 are fixed or mounted on the LED light bar 2. The another side of the LED light bar 2 which is opposite to the side of which the LED light sources 202 are mounted thereon, is bonded and affixed using the adhesive film 4 to the inner circumferential surface of the lamp tube 1. Later, the end cap 3 is fixed to the end portion of the lamp tube 1, while the LED light sources 202 and the power supply 5 are electrically connected by the LED light bar 2.

Figure 16:
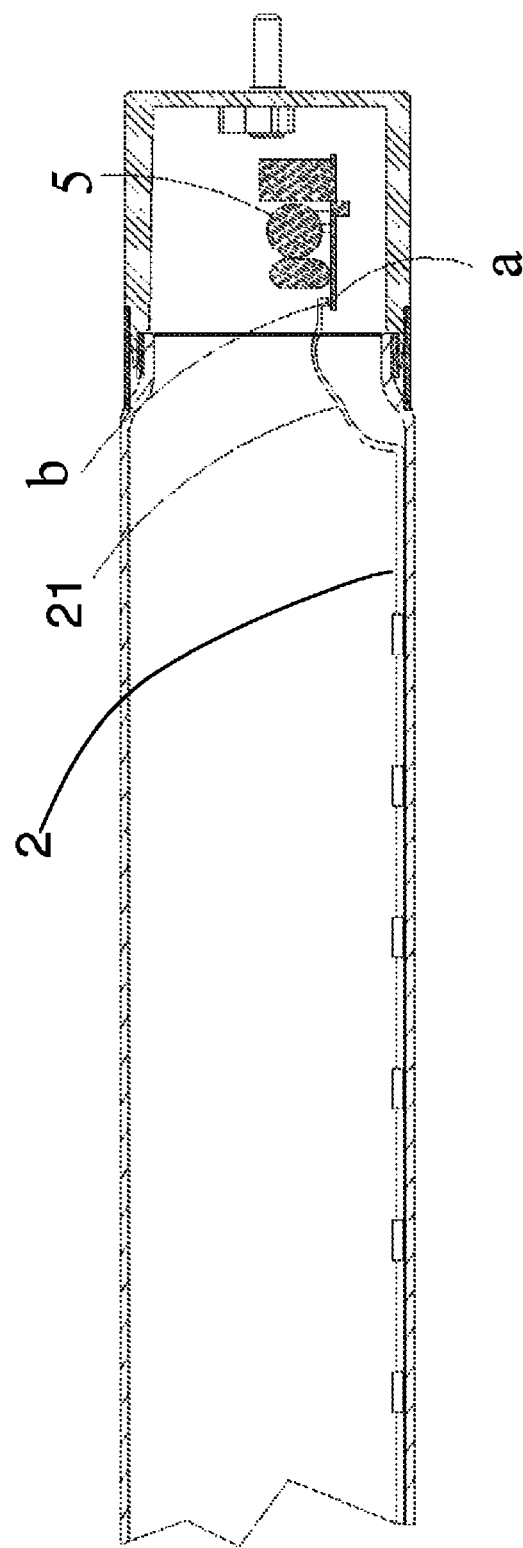
FIG. 16 is a sectional partial view of the connecting region of the lamp tube showing a connecting structure between the LED light bar and the power supply according to the embodiment of the present invention.

Alternatively, as shown in FIG. 16, the LED light bar 2 can be used to pass through the transition region 103 for providing electrical coupling to the power supply 5, or traditional wire bonding methods can be adopted to provide the electrical coupling as well. A finished LED tube lamp is then fabricated upon the attachment or joining of the end caps 3 to the lamp tube 1 as shown in FIG. 7 (with the structures shown in FIGS. 4-5), or as shown in FIG. 8 (with the structure of FIG. 9).

In the embodiment, the LED light bar 2 is fixed by the adhesive film 4 to an inner circumferential surface of the lamp tube 1, so that the LED light sources 202 are mounted in the inner circumferential surface of the lamp tube 1, which can increase the illumination angle of the LED light sources 202, thereby expanding the viewing angle, so that an excess of 330 degrees viewing angle is possible to achieve. Through the utilization of applying the electrical insulation adhesive film 7 on the LED light bar 2 and applying of the optical adhesive film 8 on the LED light sources, the electrical insulation of the LED light bar 2 is provided, so that even when the lamp tube 1 is broken, electrical shock does not occur, thereby improving safety.

Furthermore, the LED light bar 2 may be a flexible substrate, an aluminum plate or strip, or a FR4 board, in an alternative embodiment. Since the lamp tube 1 of the embodiment is a glass tube. If the LED light bar 2 adopts rigid aluminum plate or FR4 board, when the lamp tube has been rupture, e.g., broken into two parts, the entire lamp tube is still able to maintain a straight pipe or tube configuration, then the user may be under a false impression the LED tube lamp can remain usable and fully functional and easy to cause electric shock upon handling or installation thereof. Because of added flexibility and bendability of the flexible substrate for the LED light bar 2, the problem faced by the aluminum plate, FR4 board, conventional 3-layered flexible board having inadequate flexibility and bendability are thereby solved. Due to the adopting of the flexible substrate/bendable circuit sheet for the LED light bar 2, the LED light bar 2 allows a ruptured or broken lamp tube not to be able to maintain a straight pipe or tube configuration so as to better inform the user that the LED tube lamp is rendered unusable so as to avoid potential electric shock accidents from occurring. The following are further description of the flexible substrate/bendable circuit sheet used as the LED light bar 2.

The power supply 5 can be an integral unit configured with power supply electronic components mounted on a printed circuit board, the printed circuit board at an input terminal thereof can have a metal pin 502 to be connected to the end cap 3, and at an output terminal thereof can have a male plug 501, an electrical metal connection hole or a soldering pad depending upon the specific connection configuration of the LED light bar 2 (in the form of a bendable circuit sheet). The output terminals of the bendable circuit sheet (LED light bar) and the power supply can be electrically connected by means of wire bonding technique or interconnect coupling technique via the male plug 501 of the power supply 5 inserting into the female plug 201 of the LED light bar 2. When using the wire bonding technique, an outer layer of the bonding wire can be an electrical insulation sheath covering the bonding wire for providing electrical insulation and protection. Furthermore, the output terminals of the bendable circuit sheet (the LED light bar 2) and the power supply 5 can be electrically connected by other means or techniques such as rivet contacts, solder paste bonding, soldering, cable tie. The method for securing the LED light bar 2 is same as before, one side of the flexible substrate is bonded to the inner circumferential surface of the lamp tube 1 by using the adhesive film 4, and the two ends of the flexible substrate/bendable circuit sheet can be either bonded (fixed) or not bonded to the inner circumferential surface of the lamp tube 1. If the two ends of the flexible substrate arranged along an axial direction of the lamp tube 1 are not bonded or fixed to the inner circumferential surface of the lamp tube 1, and also if the wire bonding is used, the bonding wires are prone to be possibly broken apart due to sporadic motions caused by subsequent transport activities as well as being freely to move at the two ends of the flexible substrate/bendable circuit sheet. Therefore, a better option may be by soldering for forming solder joints between the flexible substrate and the power supply.

Figure 35:
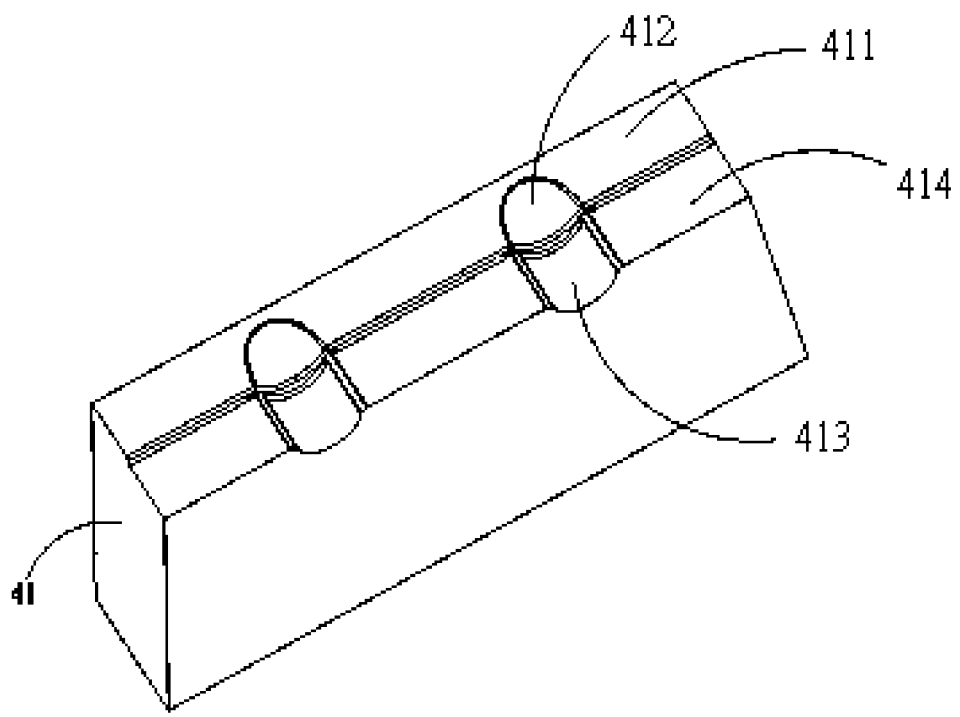
FIG. 35 is a perspective view of a thermo-compression head used for solder bonding the bendable circuit sheet to the printed circuit board of the power supply.

Referring to FIG. 16, the LED light bar 2 in the form of the bendable circuit sheet can be used to pass through the transition region 103 and soldering bonded to the output terminal of the power supply 5 for providing electrical coupling to the power supply 5, so as to avoid the usage of wire bonding, and improving upon the reliability thereof. In the illustrated embodiment, the LED light bar 2 is not fixed to an inner circumferential surface of the lamp tube at two ends thereof. The flexible substrate does not need to have the female plug 201, and the output terminal of the power supply 5 does not need to have the male plug 501. The output terminal of the power supply 5 can have one or more output terminal pads/soldering pads "a", and leaving behind an amount of tin solder on the output terminal pad "a", so that the thickness of the tin solder on the output terminal pads "a" are sufficient enough for later forming a solder joint. Likewise, the ends of the bendable circuit sheet can also have a plurality of soldering pads "b", so that the soldering pads "a" from the output terminal of the power supply 5 are soldered to the soldering pad "b" of the bendable circuit sheet. The surface on the soldering pad "b" of the bendable circuit sheet (the LED light bar 2) can be referred to as a front surface, and the other surface on the opposite side thereof can be called a back surface (and likewise, the surface on which the soldering pads "a" are located on the output terminal of the power supply 5 can also be referred to as a front surface), and the LED light bar 2/bendable circuit sheet and the power supply 2 can be connected at their respective front surfaces thereof, so as to ensure stability. However, during the soldering process, a thermo-compression head 41 as shown in FIG. 35 need to be pressed against a back surface of the bendable circuit sheet 2, and the application of heat curing across the bendable circuit sheet 2 to reach the solder disposed on the other side of the bendable circuit sheet 2 would be not as reliable and effective. Therefore, an alternative embodiment is provided in which holes in the soldering pad of the bendable circuit sheet 2 facilitating direct heating using the thermo-compression head 41 by applying heat on the front side of the bendable circuit sheet 2 to solder bond to the soldering pad "a" of the power supply 5 located on the front surface.

Figure 24:
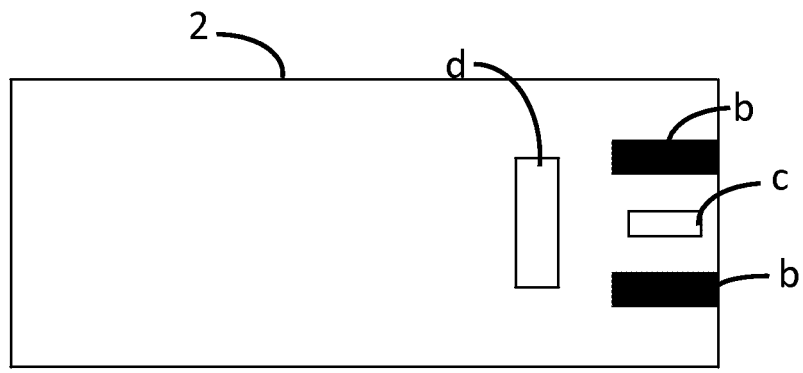
FIG. 24 is a top view of two soldering pads of a bendable circuit sheet of the LED tube lamp of one embodiment of present invention.

As shown in FIG. 24, in this embodiment, the soldering pads "b" of the bendable circuit sheet 2 are two separated pads for electrically connecting with a anode and a cathode of the bendable circuit sheet 2, respectively. The size or dimension of the soldering pads "b" is about 3.5×2 mm². The printed circuit board of the power supply 5 also has corresponding soldering pads "a". A space is left for the solder above the soldering pads "b" for the automated solder bonding equipment, in which the thickness of the solder can be 0.1 mm to 0.7 mm, with preferred thickness being 0.3 mm to 0.5 mm, and 0.4 mm being the optimal thickness thereof.

An electrically insulating hole "c" is formed and disposed between two soldering pads "b", for the sake of preventing accidental electrical short caused by adjacent solidifying solder portions from separate soldering pads that have inadvertently joined together. In addition, an alignment hole "d" can be configured and disposed behind the electrically insulating hole "c", which can be used for allowing the automated solder bonding equipment to accurately determine the correct location of the soldering pads "b" (as shown in FIG. 24). The bendable circuit sheet 2 has at least one soldering pad "b", for electrically connecting to the positive and negative electrodes of the LED light sources 202, respectively.

In other embodiments, for the sake of achieving scalability and compatibility, the number or quantity of the soldering pads "b" can be one or more, for example, one, two, three, four, or more than four. When there is just one soldering pad "b", the two ends of the bendable circuit sheet are respectively connected to the power supply to form a return circuit. In this case, electronic component replacement technique can be used, such as, i.e. replacing capacitor by inductor.

As illustrated in FIGS. 25 to 28, when the number of soldering pad "b" are three, the third soldering pad "b" can be used for ground pad, and when the number of the soldering pad "b" are four, the fourth pad can be used for the signal input terminal. Correspondingly, the soldering pad "a" and the soldering pad "b" are the same number in quantity, respectively. When the number of the soldering pad "b" is at least three, the soldering pads "b" (which are essentially bonding pads) can be arranged in one row or two rows, in accordance with dimensions of actual occupying area, so as to prevent from being too close causing electrical short circuit. In other embodiments, the soldering pad "b" can be a single bonding pad. The lesser the number of the soldering pads, the easier the fabrication process is to become. On the other hand, the more number of the soldering pads, the bendable circuit sheet and the output terminal of the power supply 5 have stronger and more secured electrical connection therebetween.

Figure 29:
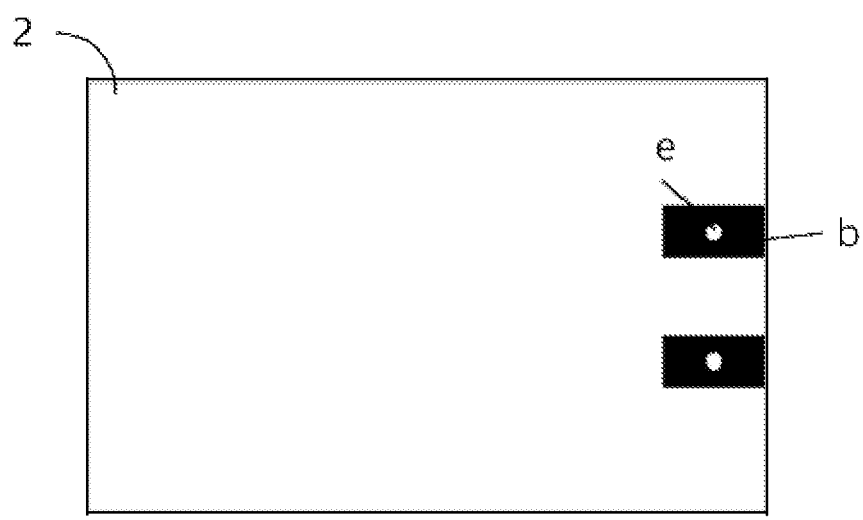
FIG. 29 is a top view of two soldering pads formed with through holes of the bendable circuit sheet of the LED tube lamp of one embodiment of present invention.
Figures 25, 26:
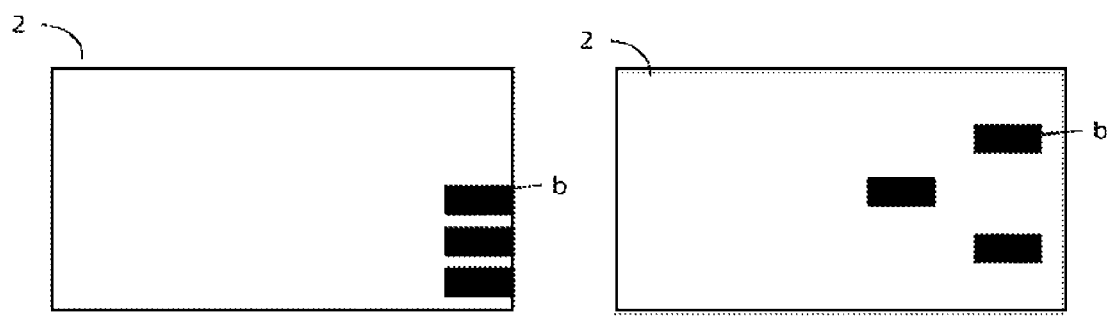
FIG. 25 is a top view of three soldering pads of the bendable circuit sheet of the LED tube lamp of one embodiment of present invention.
FIG. 26 is a top view of three soldering pads of the bendable circuit sheet of the LED tube lamp of another embodiment of present invention.
Figures 27, 28:
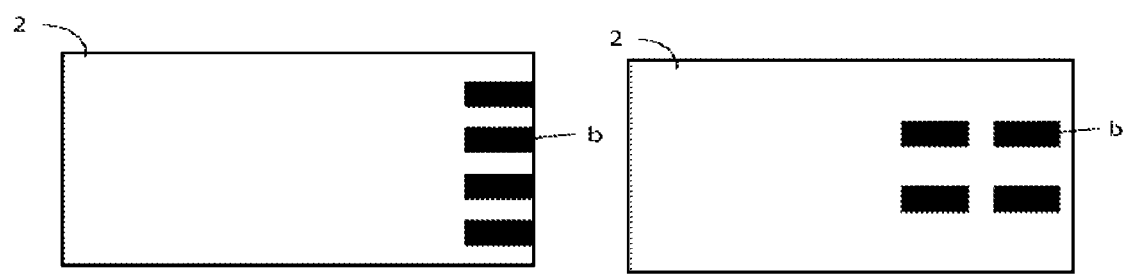
FIG. 27 is a top view four soldering pads of the bendable circuit sheet of the LED tube lamp of one embodiment of present invention.
FIG. 28 is a top view of four soldering pads of the bendable circuit sheet of the LED tube lamp of one embodiment of present invention.
Figure 30:
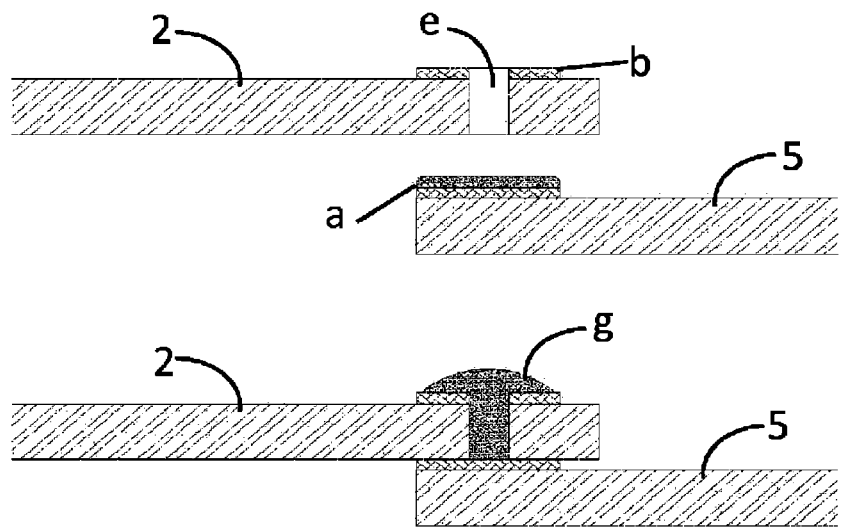
FIG. 30 is an enlarged cross-sectional view showing a soldering bonding between the printed circuit board of the power supply and the soldering pads of the bendable circuit sheet of FIG. 29.

In other embodiment as shown in FIG. 29, the inner portion of the soldering pads "b" can have a plurality of through holes "e", the soldering pad "a" can be soldered to the soldering pad "b", so that upon soldering, the tin solder can penetrate through the through holes "e" of the soldering pad "b". The through hole "e" can have a diameter of 1 mm to 2 mm, with preferred diameter being 1.2 mm to 1.8 mm, and optimal diameter being 1.5 mm. If the through hole "e" is too small, the melted solder can not pass through it during soldering bonding. Upon exiting the through holes "e", the tin solder can be accumulated surrounding the outer periphery of the opening of the through holes "e", so that upon cooling and solidifying, a plurality of solder balls "g", with diameter larger than the diameter of the through holes "e", are formed. The solder balls "g" possess similar function as nails, so that apart from having the tin solder to secure the soldering pad "a" and the soldering pad "b", the solder balls "g" further act to strengthen the electrical connection of the two pads "a", "b".

Figure 31:
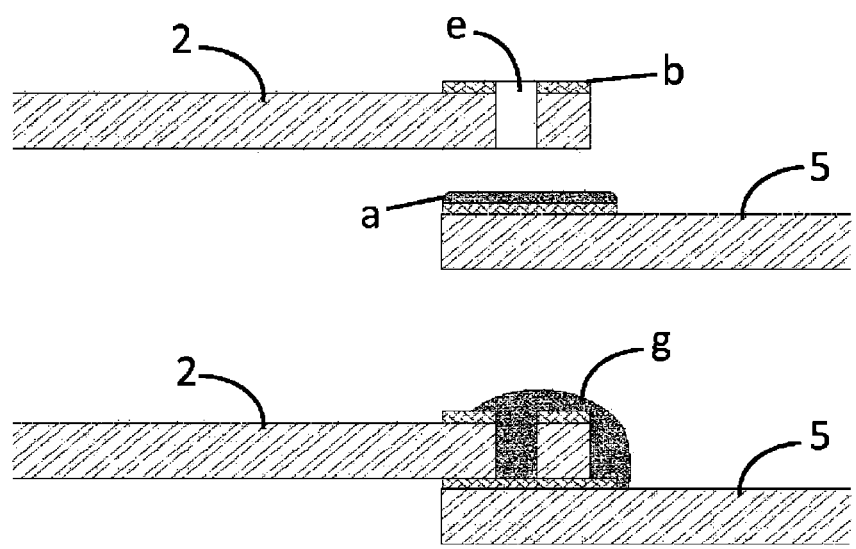
FIG. 31 is an enlarged cross-sectional view showing another soldering bonding between the printed circuit board of the power supply and the soldering pads of the bendable circuit sheet of FIG. 29, with the through holes being closer to the edge of the bendable circuit sheet.
Figure 32:
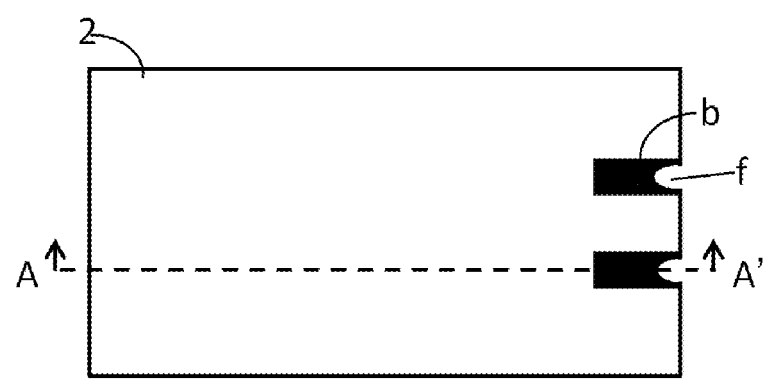
FIG. 32 is a top view of two soldering pads respectively formed with notches of the bendable circuit sheet of the LED tube lamp of another embodiment of present invention.
Figure 33:
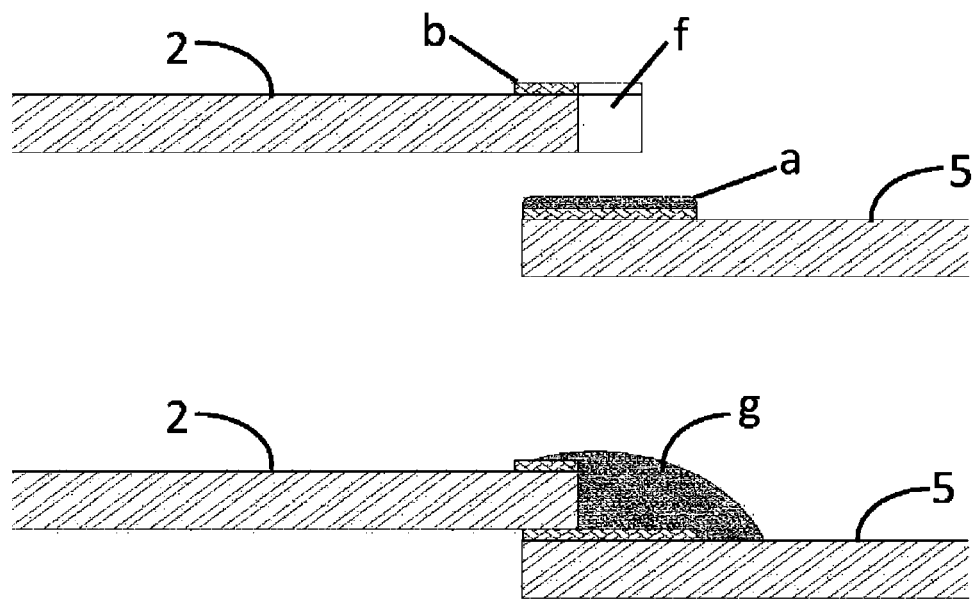
FIG. 33 is an enlarged cross-sectional view showing a soldering bonding between the printed circuit board of the power supply and the soldering pads of the bendable circuit sheet taken along dissection line A-A' of FIG. 32.
Figure 34:
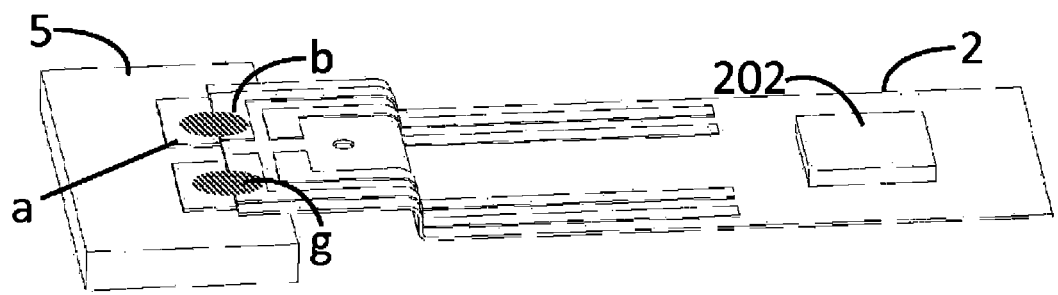
FIG. 34 is a perspective view of two soldering pads of the bendable circuit sheet of the LED tube lamp of one embodiment of present invention.

In other embodiment as shown in FIGS. 30 to 33, when a distance of the through hole "e" of the soldering pad "b" away from the edge of the bendable circuit sheet 2 is less than or equal to 1 mm (≤1 mm), the soldered tin would pass through the through-hole "e" and accumulate at periphery of the through-hole "e", meanwhile excess amount of the tin solder may also undergo reflux or reflow downward to be solidified together with the solder on the soldering pad "a" as shown in FIG. 31 in particular, and the resulting illustrated solder bonding structure has added electrical connection reliability. Furthermore, an alternative to having the through-hole "e" in the soldering pad "b" would be having a notch "f" as shown in FIGS. 32 and 33, the soldered tin can pass through the notch "f" to bond together the soldering pad "b" and the soldering pad "a", and the excess amount of the tin solder may be more easily undergo reflux or reflow downward to be solidified together with the solder on the soldering pad "a", as well as accumulating around periphery of the notch "f" as shown in FIG. 33 in particular, and the resulting illustrated solder bonding structure has added electrical connection reliability. In the present embodiment, the notch "f" of the soldering pads are disposed at the periphery and side edge thereof, that is to say, when the soldering pad "b" possesses the notch "f", the soldering pad "a" and the soldering pad "b" are securely electrically connected via the tin solder extending and filling through the notch "f", and the excess tin solder would accumulate around the periphery of the openings of the notch "f", so that upon cooling, the solder balls "g" with diameter larger than the diameter of the notch "f" are formed. In the present embodiment, due to the notch structure of the soldering pad "b", the tin solder has the function similar to C-shaped nails. Regardless of whether of forming the through holes "e" or the notch "f" of the soldering pads "b" before the solder bonding process or during the solder bonding process using the thermo-compression head 41 directly, the same through holes or notch structure of present embodiment can be formed. The (soldering) thermo-compression head 41 and a contacting surface of the tin solder can be a flat, concaved, or convex surface, the convex surface can be a long strip shape or of a grid shape. The contacting surface of the tin solder does not completely cover the through holes "e" of the soldering pads "b", so as to ensure that the tin solder can penetrate through the through holes "e". When the tin solder has accumulated around the periphery of the opening of the through holes "e", the concaved surface can provide a receiving space for the solder ball. In other embodiments, the bendable circuit sheet 2 has the alignment hole "d", which can be used to ensure precise positioning of the soldering pad "a" with respect to the soldering pad "b" during soldering bonding.

In the above embodiment, most of the bendable circuit sheet 2 is attached and secured to the inner circumferential surface of the lamp tube 1. However, the two ends of the bendable circuit sheet 2 are not secured or fixed to the inner circumferential surface of the lamp tube 1, which thereby form a freely extending end portion 21, respectively. Upon assembling of the LED tube lamp, the freely extending end portion 21 along with the soldered connection between the output terminal of the power supply 5 and itself would be coiled, curled up or deformed to be fittingly accommodating inside the lamp tube 1, so that the freely extending end portions 21 of the bendable circuit sheet 2 are deformed in shape due to being contracted or curled to fit or accommodate inside the lamp tube 1.

Using the abovementioned bendable circuit sheet 2 of having the through holes "e" in the soldering pads "b" thereof, the soldering pad "a" of the power supply 5 share the same surface with one of the surfaces of the bendable circuit sheet 2 that is mounted with the LED light source 202. In other words, the soldering pad of the bendable circuit sheet and the soldering pad of the printed circuit board of the power supply point toward same direction when soldering. When the freely extending end portions 21 of the bendable circuit sheet 2 are deformed due to contraction or curling up, a lateral tension is exerted on the power supply 5 at the connection end of the power supply 5 and the bendable circuit sheet 2. In contrast to the solder bonding technique of having the output terminal pad "a" of the power supply 5 being of different surface to one of the surfaces of the bendable circuit sheet 2 that is mounted with the LED light source 202 thereon, i.e. the soldering pad of the bendable circuit sheet and the soldering pad of the printed circuit board of the power supply point toward opposite directions when soldering, a downward tension is exerted on the power supply 5 at the connection end of the power supply 5 and the bendable circuit sheet 2, so that the bendable circuit sheet 2, with the through-hole configured soldering pads "b", form a stronger and more secure electrical connection between the bendable circuit sheet 2 and the power supply 5.

In the present embodiment, the soldering pad "b" of the bendable circuit sheet 2 is disposed on the other side thereof which has the light sources 202 mounted thereon. The soldering pads "b" of the bendable circuit sheet 2 are securely solder-bonded to the corresponding output terminal pads "a", respectively. During assembly of the LED tube lamp, the freely extending end portion 21 of the bendable circuit sheet 2 that is contracted to be deformed in shape toward the inside of the lamp tube 1, and is located at the same side as that of the bendable circuit sheet 2 with the light sources 202 mounted thereon. The through holes "e" can be fabricated before or during the soldering process. If done during the soldering process, the thermo-compression head 41 can be used to directly form the through holes "e".

As shown in FIG. 35, the thermo-compression head 41 includes a thermo-compression bonding surface 411, at least one guide channel 412, a shaping channel 413, and a pressing surface 414. The thermo-compression bonding surface 411 is to make direct contact with the tin solder, for providing the compression force and heating source during solder bonding, and shape of the thermo-compression bonding surface 411 can be flat, concaved, or convex. The concaved shape can be elongated strip or grid-like structure. The concaved-shaped thermo-compression bonding surface 411 would not completely cover the through-holes of the soldering pad. In the thermo-compression head 41 of the illustrated embodiment, a plurality of guide channels 412 that are arc-shaped concave sections are located at the lower portion of the thermo-compression bonding surface 411, which are used for guiding the flow of the melted tin solder from the thermo-compression bonding surface 411 to the through-holes "e" or the notches "f" of the soldering pads "b", the guide channels 412 also provides the function of flow or backflow blocking, so that when the melted soldered tin is being accumulated on the surface of the soldering pad "b", the shaping channel 413 being of a deeper concaved section than the adjacently-located guide channel 412, so as to provide a reserved cavity for allowing the tin solder to solidify upon cooling to become solder ball structure. The pressing surface 414 at the sides of the shaping channel 413 is a surface that is lower than the thermo-compression bonding surface 411, and the difference in height between the pressing surface 414 and the thermo-compression bonding surface 411 is configured to accommodate the overall height of the bendable circuit sheet 2 being pressed over the printed circuit board of the power supply 5 during the solder bonding process.

Figure 39:
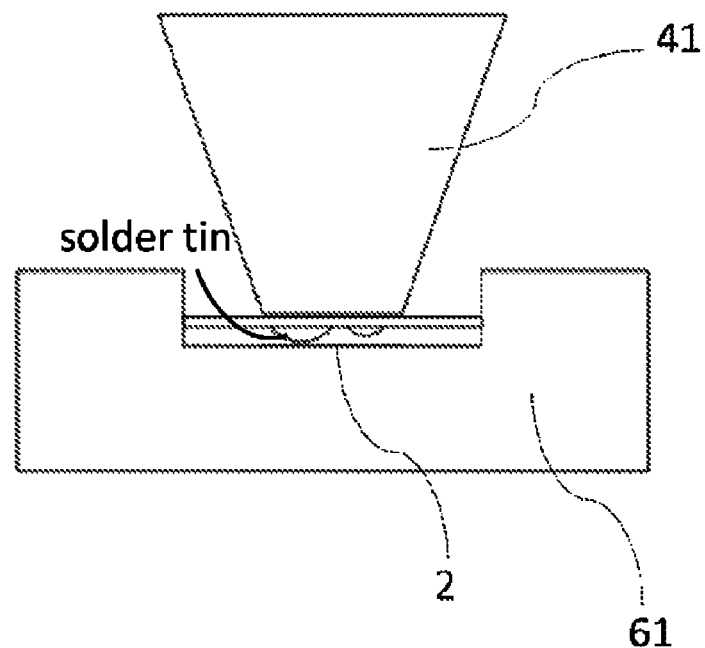
FIG. 39 shows the bendable circuit sheet and the printed circuit board of the power supply arranged between the thermo-compression head and a carrier of a soldering vehicle prior to soldering bonding step.

The tin solder has a preferred thickness of 0.3 mm to 0.5 mm for successfully and securely bonding the bendable circuit sheet 2 to the power supply 5. FIG. 39 shows an illustrative example of tin solder ball thicknesses being significantly different above two adjacent soldering pads "b", with the bendable circuit sheet 2 and the printed circuit board of the power supply 5 arranged between the thermo-compression head 41 and the carrier prior to solder bonding step. As a result of such uneven heights of the tin solder, the thermo-compression head 41 would not be able to melt the two tin solder balls evenly, that is to say, the taller solder ball is melted prior to the shorter solder ball, which results in inadequate solder bonding strength or integrity of the soldering pad having the shorter solder ball directly above thereof.

Figure 40:
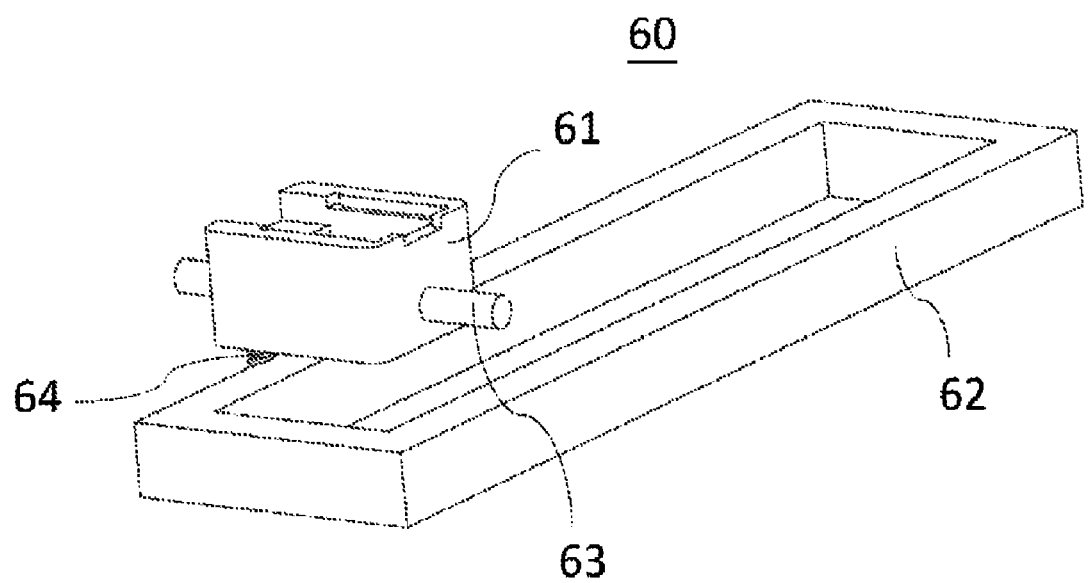
FIG. 40 shows the soldering vehicle used for soldering bonding the bendable circuit sheet and the printed circuit board of the power supply according to embodiments of present invention.

In the illustrated embodiment, the thermo-compression head 41 is configured to be adjustably rotatable so that, upon feedback of the contact force amounts exerted by the contacting of the two solder balls to the corresponding two soldering pads, the thermo-compression head 41 can adjust its roll angle accordingly for even out or balancing the contact force amounts. In the illustrated embodiment shown in FIG. 41, a different approach is adopted, in which the thermo-compression head 41 remain stationary while the bendable circuit sheet 2 is rotated by a carrier 61 of a soldering vehicle 60 as shown in FIG. 40. The soldering vehicle 60 includes a carrier 61, a carrier frame 62, a rotating cam 63, and two spring pieces 64. The carrier 61 is used for holding the bendable circuit sheet 2 and the power supply 5. The carrier frame 62 is configured to carry the carrier 61. The carrier 61 includes the rotating cam 63, which serves the purpose of rotating the carrier 61 in roll direction thereof, and the two spring pieces 64 which function as force balancing mechanism to assist in maintaining balance in force exertion. The bendable circuit sheet 2 together with the power supply 5 can be mounted on the carrier 61 of the soldering vehicle 60.

Figure 41:
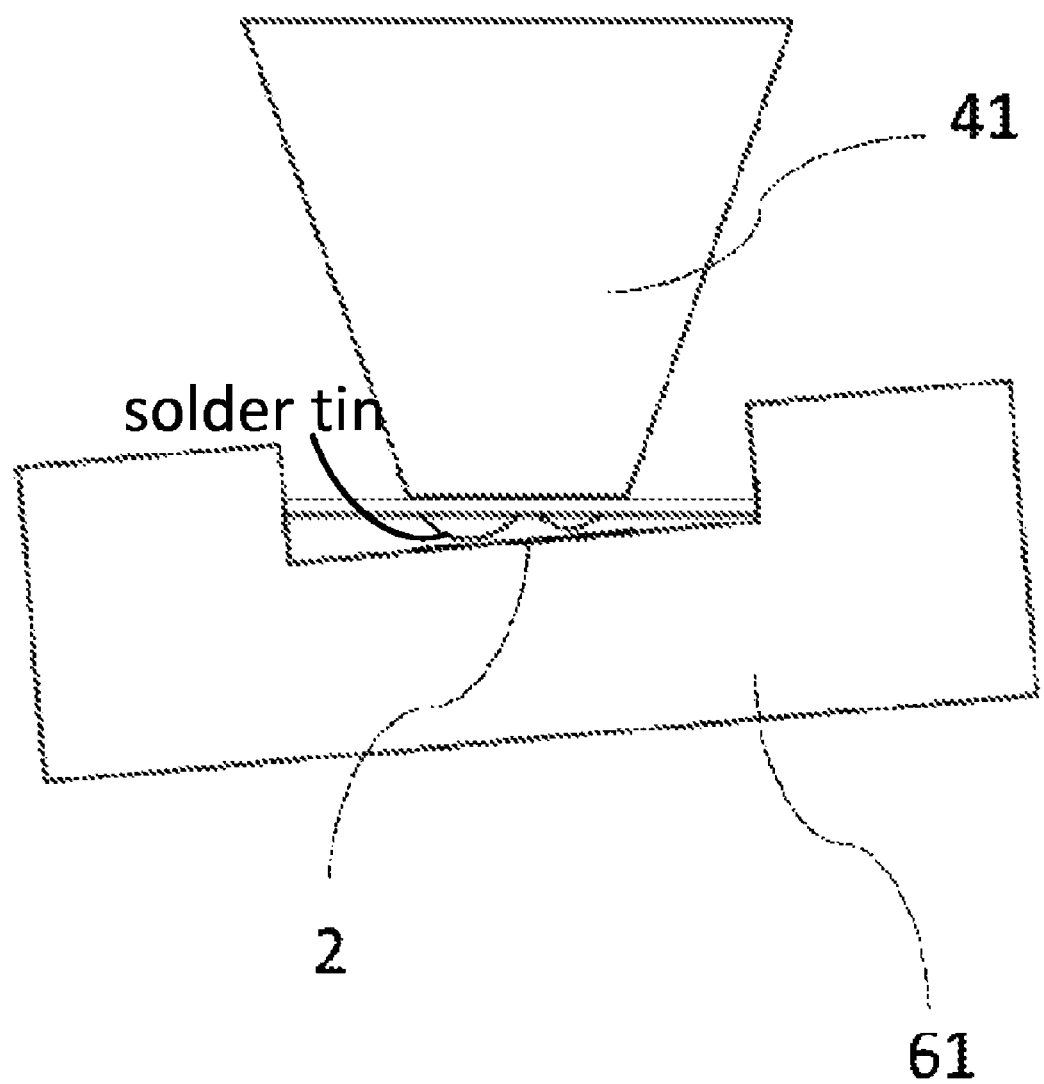
FIG. 41 shows the bendable circuit sheet and the printed circuit board of the power supply correctively arranged between the thermo-compression head and the carrier of the soldering vehicle after the soldering bonding step according to an embodiment of present invention.

As shown in FIG. 41, by rotating the carrier 61 via the rotating cam 63 thereof, tin solder balls of significantly different thicknesses above two adjacent soldering pads can be properly accommodated for achieving balanced contact with the soldering pad so as to improve solder bonding strength or integrity. The usage of a drive motor for actuating the rotation of the carrier 61 instead of using the rotating cam 63 and the two spring pieces 64 can also be adopted in alternative embodiment, in which case the carrier frame 62 is not needed.

If the two ends of the bendable circuit sheet 2 are to be securely fixed to the inner circumferential surface of the lamp tube 1, the female plug 201 is mounted on the bendable circuit sheet 2, and the male plug 501 of the power supply 5 is inserted into the female plug 201, in that order, so as to establish electrical connection therebetween. Direct current (DC) signals are carried on a conductive wiring layer 2a of the bendable circuit sheet 2, unlike the 3-layered conventional flexible substrates for carrying high frequency signals using a dielectric layer.

One of the advantage of using the bendable circuit sheet as shown in illustrated embodiment of FIG. 16 over conventional rigid LED light bar is that damages or breakages occurring during the wire bonding of the LED light bar and the power supply of the lamp tube (for conventional rigid LED light bar) is prevented by solder bonding of the bendable circuit sheet and then coiled back into the lamp tube to arrive at proper position inside the lamp tube.

Figure 17:
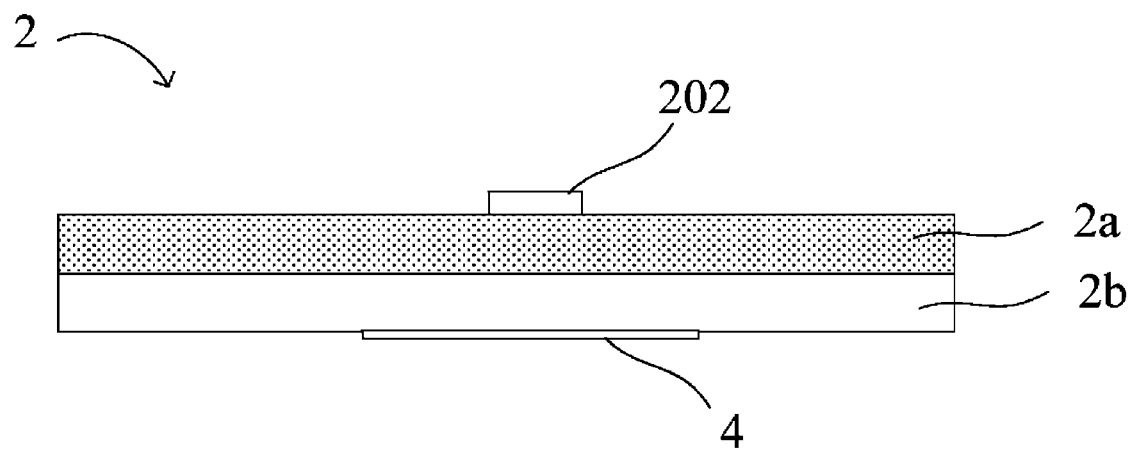
FIG. 17 is a cross-sectional view of a two-layered flexible substrate of the LED tube lamp of the embodiment of the present invention.

Referring to illustrated embodiment of FIG. 17, the LED light bar 2 is a bendable circuit sheet which includes a conductive wiring layer 2a and a dielectric layer 2b that are arranged in a stacked manner. The LED light source 202 is disposed on a surface of the conductive wiring layer 2a away from the dielectric layer 2b. In other words, the dielectric layer 2b is disposed on a surface of the conductive wiring layer 2a that is away from the LED light sources 202. The conductive wiring layer 2a is electrically connected to the power supply 5. Meanwhile, the adhesive film 4 is disposed on a surface of the dielectric layer 2b away from the conductive wiring layer 2a to bond and to fix the dielectric layer 2b to the inner circumferential surface of the lamp tube 1. The conductive wiring layer 2a can be a plurality of conductive metal traces serving as a power supply layer, or can be bonding wires such as copper wire.

In alternative embodiment, the LED light bar 2 further includes a circuit protection layer (not shown). In another alternative embodiment, the dielectric layer can be omitted, in which the conductive wiring layer is directly bonded to the inner circumferential surface of the lamp tube. The circuit protection layer can be an ink material, possessing functions as solder resist and optical reflectance. Whether the conductive wiring layer 2a is of one-layered, or two-layered structure, the circuit protective layer can be adopted. The circuit protection layer can be disposed on the side/surface of the LED light bar 2, such as the same surface of the conductive wiring layer which has the LED light source 202 disposed thereon.

It should be noted that, in the present embodiment, the bendable circuit sheet is a one-layered structure made of just one layer of the conductive wiring layer 2a, or a two-layered structure (made of one layer of the conductive wiring layer 2a and one layer of the dielectric layer 2b), and thus would be more bendable or flexible to curl than the conventional three-layered flexible substrate. As a result, the bendable circuit sheet (the LED light bar 2) of the present embodiment can be installed in other lamp tube that is of a customized shape or non-linear shape, and the bendable circuit sheet can be mounted touching the sidewall of the lamp tube. The bendable circuit sheet mounted closely to the tube wall is one preferred configuration, and the fewer number of layers thereof, the better the heat dissipation effect, and the lower the material cost. Of course, the bendable circuit sheet is not limited to being one-layered or two-layered structure only, while in another embodiment, the bendable circuit sheet can include multiple layers of the conductive wiring layers 2a and multiple layers of the dielectric layers 2b, in which the dielectric layers 2b and the conductive wiring layers 2a are sequentially stacked in a staggered manner, respectively, to be disposed on the surface of the one conductive wiring layer 2a that is opposite from the surface of the one conductive wiring layer 2a which has the LED light source 202 disposed thereon.

The LED light source 202 is disposed on the uppermost layer of the conductive wiring layers 2a, and is electrically connected to the power supply 5 through the (uppermost) conductive wiring layer 2a. Furthermore, the inner circumferential surface of the lamp tube 1 or the outer circumferential surface thereof is covered with an adhesive film (not shown), for the sake of isolating the inner content from outside content of the lamp tube 1 after the lamp tube 1 has been ruptured. The present embodiment has the adhesive film coated on the inner circumferential surface of the lamp tube 1.

Figure 36:
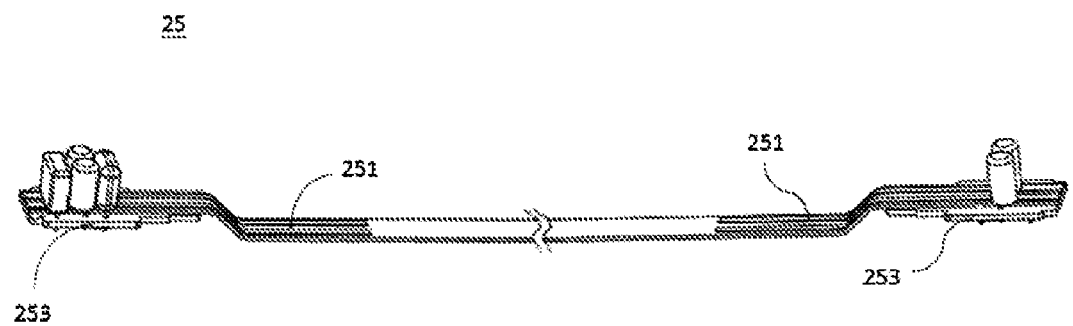
FIG. 36 is a perspective view of a bendable circuit sheet according to another embodiment of present invention electrically connected to the printed circuit board of the power supply.
Figure 37:
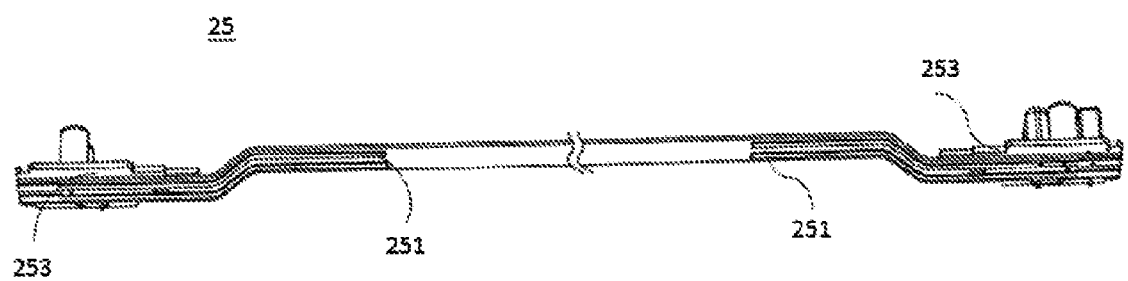
FIG. 37 is a perspective view of the bendable circuit sheet according to another embodiment of present invention electrically connected to the printed circuit board of the power supply in a different configuration from that shown in FIG. 36.

In alternative embodiment as shown in FIGS. 36 and 37, the solder bonded bendable circuit sheet 2 and the power supply 5 can be replaced by a circuit board assembly 25. The circuit board assembly 25 includes a longer circuit board 251 and a shorter circuit board 253 that are adhered together. The longer circuit board 251 and the shorter circuit board 253 can be securely fixed by adhesive. The longer circuit board 251 can be a flexible circuit board or the bendable circuit sheet 2. The shorter circuit board 253 can be a rigid board, have a length of 15 mm to 40 mm, with preferred length of 19 mm to 36 mm. The longer circuit board 251 can have a length of 800 mm to 2800 mm, with preferred length being 1200 mm to 2400 mm.

But the lengths of the shorter circuit board 253 and the longer circuit board 251 can also be changed to adapt to various different LED tube lamp dimensions. As shown in FIG. 36, the electronic components mounted on the shorter circuit board 253 are electrically connected to the longer circuit board 251 via a conductive wiring layer at a same side as that of the electronic components. As shown in FIG. 37, the electronic components are mounted on the shorter circuit board 253 and the electronic components and the conductive wiring layer of the longer circuit board 251 are at opposite sides of the shorter board 253. The circuit board assembly 25 does not require solder bonding between the bendable circuit sheet 2 to the power supply 5, but instead, the longer circuit board 251 and the shorter circuit board 253 are adhesively secured, followed by electrically connecting the electronic components on the shorter circuit board 253 to the longer circuit board 251 by using the conductive circuit layer to the longer circuit board 251.

In a preferred embodiment, the lamp tube 1 can be a glass tube with a coated adhesive film on the inner wall thereof (not shown). The coated adhesive film also serves to isolate and segregate the inside and the outside contents of the lamp tube 1 upon being ruptured thereof. The coated adhesive film material includes methyl vinyl silicone oil, hydro silicone oil, Xylene, and calcium carbonate The methyl vinyl silicone oil chemical formula is: $(C_2H_8OSi)n.C_2H_3$. The hydro-silicon oil chemical formula is: $C_3H_9OSi—(CH_4OSi)n.C_3H_9Si$; and the product produced is polydimethylsiloxane (silicone elastomer), which has chemical formula as follow:

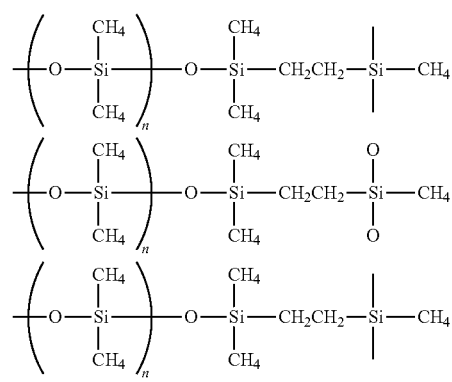

Xylene is used as an auxiliary material. Upon solidifying or hardening of the coated adhesive film when coated on the inner circumferential surface of the lamp tube 1, the xylene will be volatilized and removed. The xylene is mainly used for the purpose of adjusting the degree of adhesion or adhesiveness, which can then adjust the thickness of the bonding adhesive thickness. In the present embodiment, the thickness of the coated adhesive film can be between 10 to 800 microns ($\mu$m), and the preferred thickness of the coated adhesive film can be between 100 to 140 microns ($\mu$m). This is because the bonding adhesive thickness being less than 100 microns, does not have sufficient shatterproof capability for the glass tube, and thus the glass tube is prone to crack or shatter. At above 140 microns of bonding adhesive thickness would reduce the light transmittance rate, and also increase material cost. Vinyl silicone oil+hydrosilicone oil allowable ratio range is (19.8-20.2):(20.2-20.6), but if exceeding this allowable ratio range, would thereby negatively affect the adhesiveness or bonding strength. The allowable ratio range for the xylene and calcium carbonate is (2-6):(2-6), and if lesser than the lowest ratio, the light transmittance of the lamp tube will be increased, but grainy spots would be produced or resulted from illumination of the LED lamp tube, negatively affect illumination quality and effect.

If the LED light bar 2 is configured to be a flexible substrate, no coated adhesive film is thereby required.

Figure 18:
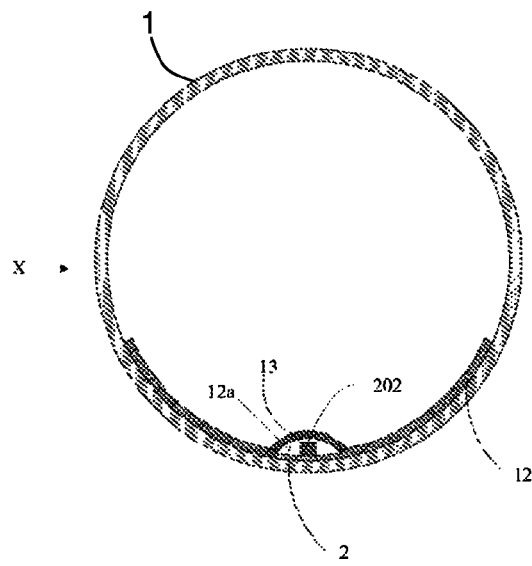
FIG. 18 is an end cross-sectional view of the lamp tube of the LED tube lamp having two reflective film layers respectively disposed on two sides of the LED light bar as taken along axial direction of the lamp tube, according to one embodiment of present invention.

To improve the illumination efficiency of the LED tube lamp, the lamp tube 1 has been modified according to a first embodiment of present invention by having a diffusion film layer 13 coated and bonded to the inner wall thereof as shown in FIG. 18, so that the light outputted or emitted from the LED light sources 202 is transmitted through the diffusion film layer 13 and then through the lamp tube 1. The diffusion film layer 13 allows for improved illumination distribution uniformity of the light outputted by the LED light sources 202.

The diffusion film layer 13 can be coated onto different locations, such as onto the inner wall or outer wall of the lamp tube 1 or onto the diffusion coating layer (not shown) at the surface of each LED light source 202, or coated onto a separate membrane cover covering the LED light source 202. The diffusion film layer 13 in the illustrated embodiment of FIG. 18 is a diffusion film that is not in contact with the LED light source 202 (but covering above or over to enshrouding the LED light sources underneath thereof). The diffusion film layer 13 can be an optical diffusion film or sheet, usually made of polystyrene (PS), polymethyl methacrylate (PMMA), polyethylene terephthalate (PET), and/or polycarbonate (PC), in one composite material composition thereof.

In alternative embodiment, the diffusion film layer can be an optical diffusion coating, which has a material composition to include at least one of calcium carbonate, halogen calcium phosphate and aluminum oxide that possesses excellent light diffusion and transmittance to exceed 90%. Further, the applying of the diffusion film layer made of optical diffusion coating material to outer circumferential surface of the rear end region 101 along with the hot melt adhesive 6 would produce or generate increased friction resistance between the end cap and the lamp tube due to the presence of the optical diffusion coating (when compared to that of an example that is without any optical diffusion coating), which is beneficial for preventing accidental detachment of the end cap from the lamp tube.

Composition of the diffusion film layer made by the optical diffusion coating for the alternative embodiment includes calcium carbonate (e.g., CMS-5000, white powder), thickening agents, and a ceramic activated carbon (e.g., ceramic activated carbon SW—C, which is a colorless liquid). Specifically, average thickness of the diffusion film layer or the optical diffusion coating falls between 20~30 $\mu$m after being coated on the inner circumferential surface of the glass tube, where finally the deionized water will be evaporated, leaving behind the calcium carbonate, ceramic activated carbon and the thickener. Using this optical diffusion coating material for forming the diffusion film layer 13, a light transmittance of about 90% can be achieved.

Generally speaking, the light transmittance rate of the diffusion film layer 13 ranges from 85% to 96%. Furthermore, in another possible embodiment, the light transmittance rate of the diffusion film layer can be 92%-94% while the thickness range is 200-300 $\mu$m which can have other effect. In addition, this diffusion film layer 13 can also provide electrical isolation for reducing risk of electric shock to a user upon breakage of the lamp tube. Furthermore, the diffusion film layer 13 provides an improved illumination distribution uniformity of the light outputted by the LED light sources 202 so as to avoid the formation of dark regions seen inside the illuminated or lit up lamp tube 1.

In other embodiments, the optical diffusion coating can also be made of strontium phosphate (or a mixture of calcium carbonate and strontium phosphate) along with a thickening agent, ceramic activated carbon and deionized water, and the coating thickness can be same as that of present embodiment. In another preferred embodiment, the optical diffusion coating material may be calcium carbonate-based material with a small amount of reflective material (such as strontium phosphate or barium sulfate), the thickener, deionizes water and carbon activated ceramic to be coated onto the inner circumferential surface of the glass tube with the average thickness of the optical diffusion coating falls between 20~30 $\mu$m. Then, finally the deionized water will be evaporated, leaving behind the calcium carbonate, the reflective material, ceramic activated carbon and the thickener.

The diffusion phenomenon in microscopic terms, light is reflected by particles. The particle size of the reflective material such as strontium phosphate or barium sulfate will be much larger than the particle size of the calcium carbonate. Therefore, selecting a small amount of reflective material in the optical diffusion coating can effectively increase the diffusion effect of light. In other embodiments, halogen calcium phosphate or aluminum oxide micro-diffusion coating can also be served as the main material for forming the diffusion film layer 13. The diameter of the calcium carbonate particles is 2 $\mu$m~4 $\mu$m, and the diameter of the particles of halogen calcium phosphate and aluminum oxide are about 4 $\mu$m~6 $\mu$m and 1 $\mu$m~2 $\mu$m, respectively.

For satisfying transmittance of 85%~92%, when using calcium carbonate, the diffusion film layer 13 would have an average thickness of 20 $\mu$m~30 $\mu$m, meanwhile when using halogen calcium phosphate, the diffusion film layer 13 would have an average thickness of 25 $\mu$m~35 $\mu$m, whereas when using aluminum oxide, the diffusion film layer 13 would have an average thickness of 10 $\mu$m~15 $\mu$m. For satisfying transmittance rate above 92%, the diffusion film layer 13 should be thinner in thickness. In other words, the diffusion film layer thickness can be further adjusted according to desired light transmittance requirement.

In the present embodiment, the diffusion film layer 13 is formed by two methods, including: (1) a pressure coating method: first after the entire lamp tube is erected upright, a diffusion coating equipment using an exerted pressure fills the inside of the lamp tube with a diffusion coating solution; later the pressure is reduced to normal ambient pressure; due to the diffusion coating solution containing a thickening agent to increase the viscosity of the diffusion coating material such as calcium carbonate when attaching and bonding to the inner circumferential surface of the lamp tube, after the excess diffusion coating solution is recovered back to the diffusion coating equipment, air drying step is performed to convert the diffusion coating solution to the (dry) diffusion film layer formed on the inner circumferential surface of the lamp tube. (2) spray coating method: using a diffusion coating solution spraying equipment, the entire inner circumferential surface of the lamp tube is sprayed with a diffusion coating solution, while the lamp tube can be tilted at an angle or rotated in order to increase the uniformity of the diffusion coating attached to the inner circumferential surface of the lamp tube; finally, air drying is performed to convert the diffusion coating solution to the (dry) diffusion film layer evenly formed on the inner circumferential surface of the lamp tube.

Furthermore, as shown in FIG. 18, the inner circumferential surface of the lamp tube 1 is also provided or bonded with a reflective film layer 12, the reflective film layer 12 is provided around the LED light bar 2, and occupy a portion of an area of the inner circumferential surface of the lamp tube 1 arranged along the circumferential direction thereof. As shown in FIG. 18, the reflective film layer 12 is disposed at two sides of the LED light bar 2 extending along a circumferential direction of the lamp tube. The reflective film layer 12 when viewed by a person looking at the lamp tube from the side (in the X-direction shown in FIG. 18) serve to block the LED light sources 202, so that the person does not directly see the LED light sources 202, thereby reducing the visual graininess effect. On the other hand, the reflective film 12 reflect light emitted from the LED light source 202, and can utilized to control the divergence angle of the LED tube lamp, so that more light is emitted in the direction without coating with the reflective film, such that the LED tube lamp has higher energy efficiency when providing same level of illumination performance.

Specifically, the reflection film layer 12 provided on the inner circumferential surface of the lamp tube 1, and has a opening 12a on the reflective film layer 12 which is configured corresponding to the location of the LED light bar 2, the size of the opening 12a is the same or slightly larger than the size of the LED light bar 2. During assembly, the LED light sources 202 are mounted on the LED light bar 2 (or bendable circuit sheet) provided on the inner circumferential surface of the lamp tube 1, and then the reflective film layer 12 is adhered to the inner circumferential surface of the lamp tube, so that the opening 12a of the reflective film layer 12 is matched to the corresponding LED light bar 2 in a one-to-one relationship, and the LED light sources 202 are exposed to the outside of the reflective film layer 12.

In the present embodiment, the reflectance of the reflective film layer 12 is at least greater than 85%. Better reflectance of 90% can also be achieved. Meanwhile, more preferably reflectance at more than 95% reflectance can also be achievable, in order to obtain more reflectance. The reflective film layer 12 extends circumferentially along the length of the lamp tube 1 occupying about 30% to 50% of the inner circumferential surface area of the lamp tube 1. In other words, extending along a circumferential direction of the lamp tube 1, a circumferential length of the reflective film layer 12 along the inner circumferential surface of the lamp tube 1 and a circumferential length of the inner circumferential surface of the lamp tube 1 has a ratio of 0.3 to 0.5.

In the illustrated embodiment of FIG. 18, the reflective film layer 12 is disposed substantially in the middle along a circumferential direction of the lamp tube 1, so that the two distinct portions or sections of the reflective film layer 12 disposed on the two sides of the LED light bar 2 are substantially equal in area. The reflective film layer 12 material may be made of PET or selectively adding some reflective materials such as strontium phosphate or barium sulfate, with a thickness of 140 µm to 350 µm, or of 150 µm to 220 µm in a more preferred embodiment. In other embodiments, the reflective film layer 12 may be provided in other forms, for example, along the circumferential direction of the lamp tube 1 on one or both sides of the LED light source 202, while occupying the same 30% to 50% of the inner circumferential surface area of the lamp tube 1.

Alternatively, as shown in FIG. 13, the reflective film layer 12 can be without any openings, so that the reflective film layer 12 is directly adhered or mounted to the inner circumferential surface of the lamp tube 1 as that of illustrated embodiment, and followed by mounting or fixing the LED light bar 2, with the LED light sources 202 already being mounted thereon, on the reflective film layer 12. In another embodiment, just the reflection film layer 12 may be provided without a diffusion film layer 13 being present, as shown in FIG. 14.

Figure 19:
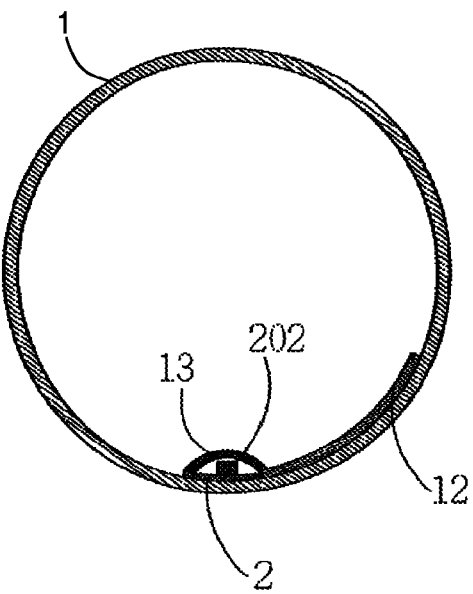
FIG. 19 is an end cross-sectional view of the lamp tube of the LED tube lamp having a reflective film layer disposed on one side of the LED light bar as taken along axial direction of the lamp tube, according to another embodiment of present invention.
Figure 20:
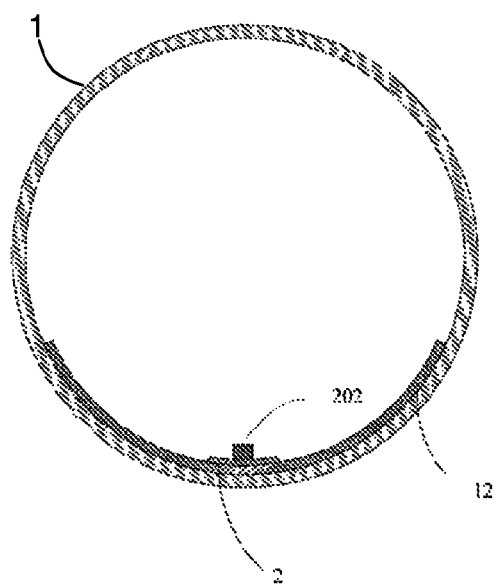
FIG. 20 is an end cross-sectional view of the lamp tube of the LED tube lamp having a reflective film layer disposed under the LED light bar as taken along axial direction of the lamp tube, according to another embodiment of present invention.
Figure 21:
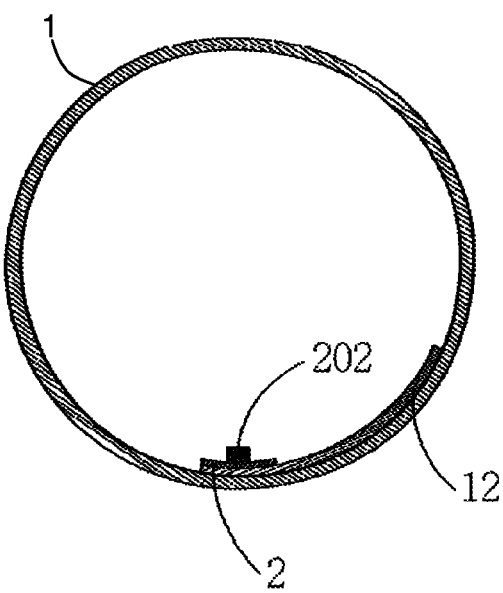
FIG. 21 is an end cross-sectional view of the lamp tube of the LED tube lamp having a reflective film layer disposed under and beside one side of the LED light bar as taken along axial direction of the lamp tube, according to yet another embodiment of present invention.
Figure 22:
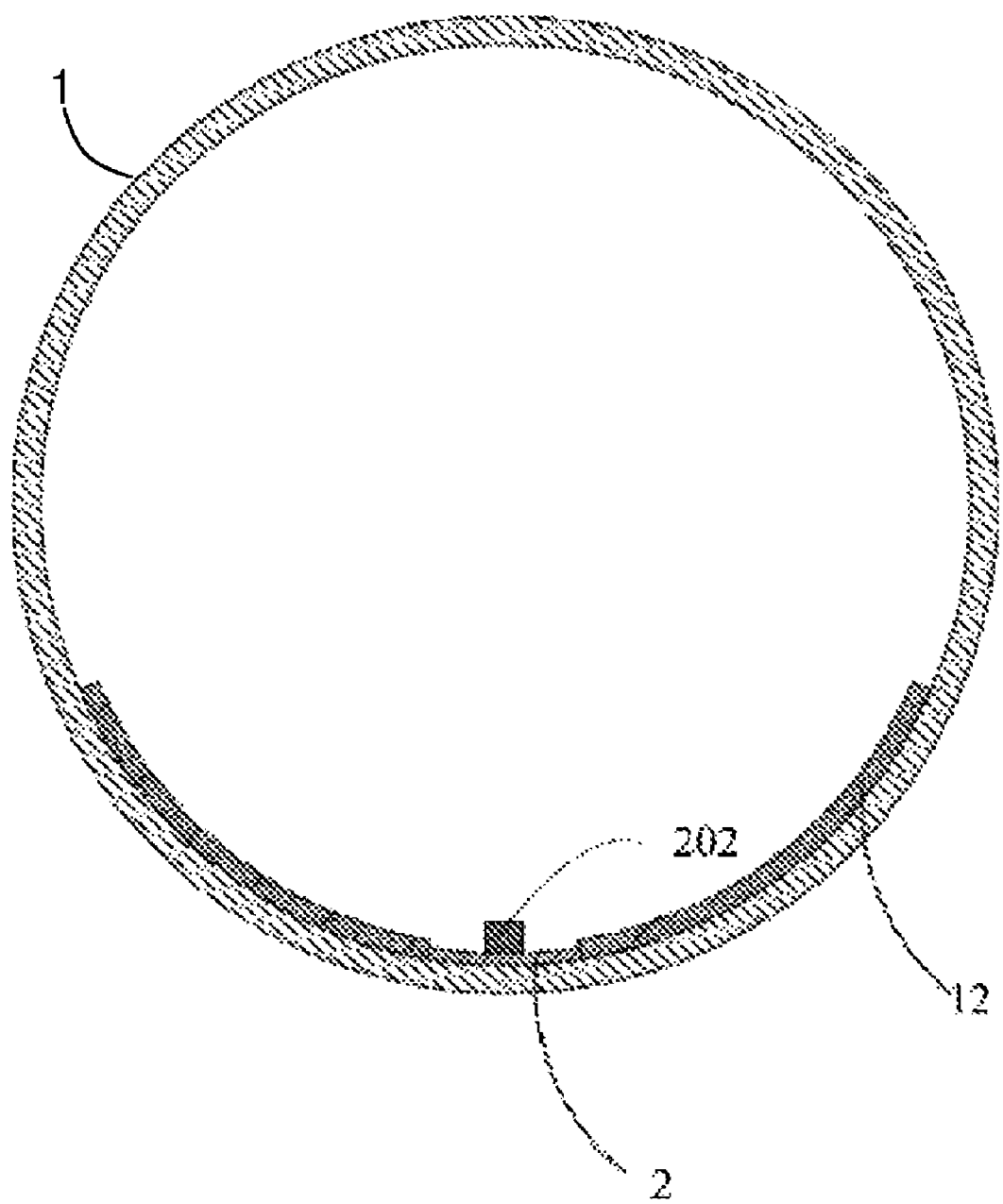
FIG. 22 is an end cross-sectional view of the lamp tube of the LED tube lamp having two reflective film layers respectively disposed on two sides of the LED light sources as taken along axial direction of the lamp tube, according to yet another embodiment of present invention.

In another embodiment, the reflective film layer 12 and the LED light bar 2 are contacted on one side thereof as shown in FIG. 19. In addition, a diffusion film layer 13 is disposed above the LED light bar 2. Referring to FIG. 21, the LED light bar 2 (with the LED light sources 202 mounted thereon) is directly disposed on the reflective film layer 12, and the LED light bar 2 is disposed at an end region of the reflective layer 12 (without having any diffusion layer) of the LED tube lamp of yet another embodiment of present invention.

In other embodiments, the width of the LED light bar 2 (along the circumferential direction of the lamp tube) can be widened to occupy a circumference area of the inner circumferential surface of the lamp tube 1 at a ratio ranging from 0.2 to 0.5, and preferably ranging from 0.3 to 0.5, in which the widened portion of the LED light bar 2 can provide reflective effect similar to the reflective film. As described in the above embodiment, the LED light bar 2 may be coated with a circuit protection layer, the circuit protection layer may be an ink material, providing an increased reflective function, with a widened flexible substrate using the LED light sources as starting point to be circumferentially extending, so that the light is more concentrated. In the present embodiment, the circuit protection layer is coated on just the top side of the LED light bar 2 (in other words, being disposed on an outermost layer of the LED light bar 2 (or bendable circuit sheet).

In the embodiment shown in FIGS. 18-21, the inner circumferential surface of the glass lamp tube, can be coated and/or covered entirely or partially with an optical diffusion coating layer (parts that have the reflective film being coated would not be coated by the optical diffusion coating). The optical diffusion coating is preferably applied to the outer circumferential surface at the end region of the lamp tube 1, so that the end cap 3 and the lamp tube 1 can be bonded more firmly.

Referring to FIG. 23, the LED light source 202 may be further modified to include a LED lead frame 202b having a recess 202a, and an LED chip 18 disposed in the recess 202a. The recess 202a is filled with phosphor, the phosphor coating is covered on the LED chip 18 to convert to the desired color light. Unlike dimensional configuration of conventional LED die or chip which has a length to width ratio of roughly 1:1, the LED chip 18 has a length to width ratio ranging from 2:1 to 10:1, with the illustrated embodiment having a length to width ratio ranging from 2.5:1 to 5:1, and an optimal length to width range from 3:1 to 4.5:1. As a result, the length direction of the LED die (or chip) 18 can be arranged or aligned along the length direction of the lamp tube 1, so that average current density of the LED chip 18 and overall illumination quality are further improved.

In one lamp tube 1, there are multiple number of LED light sources 202, which are arranged into one or more rows, each row of the LED light sources 202 is arranged along the axis direction or length direction (Y-direction) of the lamp tube 1. The recess 202a belonging to each LED lead frame 202b may be one or more. In the illustrated embodiment, each LED lead frame 202b has one recess 202a, and correspondingly, the LED lead frame 202b includes two first sidewalls 15 arranged along a length direction (Y-direction) of the lamp tube 1, and two second sidewalls 16 arranged along a width direction (X-direction) of the lamp tube 1. In the present embodiment, the first sidewall 15 is extending along the width direction (X-direction) of the lamp tube 1, the second sidewall 16 is extending along the length direction (Y-direction) of the lamp tube 1. The first sidewall 15 is lower in height than the second sidewall 16. The recess 202a is enclosed by the first sidewalls 15 and the second sidewalls 16.

In other embodiments, in one row of the LED light sources, it is permissible to have one or more sidewalls of the LED lead frames of the LED light sources to adopt other configuration or manner of extension structures. When the user is viewing the along the X-direction toward the lamp tube, the second sidewall 16 can block the line of sight of the user to the LED light source 202, thus reducing unappealing grainy spots. The first sidewall 15 can be extended along the width direction of the lamp tube 1, but as long as being extended along substantially similar to the width direction to be considered sufficient enough, and without requiring to be exactly parallel to the width direction of the lamp tube 1, and may be in a different structure such as zigzag, curved, wavy, and the like. The second sidewall 16 can be extended along the length direction of the lamp tube 1 but as long as being extended along substantially similar to the length direction to be considered sufficient enough, and without requiring to be exactly parallel to the length direction of the lamp tube 1, and may be in a different structure such as zigzag, curved, wavy, and the like.

Having the first sidewall 15 being of a lower height than the second sidewall 16 is beneficial for allowing light illumination to be easily dispersed beyond the LED lead frame 202b, and no grainy effect is produced upon viewing in the Y-direction. The first sidewall 15 includes an inner surface 15a. The inner surface 15a of the first sidewall 15 is a sloped surface, which promotes better light guiding effect for illumination and facing toward outside of the recess. The inner surface 15a can be a flat or curved surface. The slope of the inner surface 15a is between about 30 degrees to 60 degrees. In other words, the included angle between the bottom surface of the recess 202a and the inner surface 15a is between 120 and 150 degrees. In other embodiments, the slope of the inner surface of the first sidewall can also be about 15 degrees to 75 degrees, that is, the included angle between the bottom surface of the recess 202a and the inner surface of the first sidewall is 105 degrees to 165 degrees. Alternatively, the slope may be a combination of flat and curved surface.

In other embodiments, if there are several rows of the LED light sources 202, arranged in a length direction (Y-direction) of the lamp tube 1, as long as the LED lead frames 202b of the LED light sources 202 disposed in the outermost two rows (at closest to the lamp tube) along in the width direction of the lamp tube 1, are to have two first sidewalls 15 configured along the length direction (Y-direction) and two second sidewalls 16 configured in one straight line along the width direction (X-direction), so that the second sidewalls 16 are disposed on a same side of the same row are collinear to one another. However, the arrangement direction of the LED lead frames 202b of the other LED light sources 202 that are located between the aforementioned LED light sources 202 disposed in the outermost two rows are not limited, for example, for the LED lead frames 202b of the LED light sources 202 located in the middle row (third row), each LED lead frame 202b can include two first sidewalls 15 arranged along in the length direction (Y-direction) of the lamp tube 1, and two second sidewalls 16 arranged along in the width direction (X-direction) of the lamp tube 1, or alternatively, each LED lead frame 202b can include two first sidewalls 15 arranged along in the width direction (X-direction) of the lamp tube 1, and two second sidewalls 16 arranged along in the length direction (Y-direction) of the lamp tube 1, or arranged in a staggered manner. When the user is viewing from vantage point from the side of the lamp tube along the X-direction, the outermost two rows of the LED lead frames 202b of the LED light sources 202 can block the user's line of sight for directly seeing the LED light sources 202. As a result, the visual graininess unpleasing effect is reduced.

Similar to the present embodiment, with regard to the two outermost rows of the LED light sources, one or more of the sidewalls of the LED lead frames of the LED light sources to adopt other configurational or distribution arrangement. When multiple number of the LED light sources 202 are distributed or arranged along the length direction of the lamp tube in one row, the LED lead frames 202b of the multiple number of the LED light sources 202 have all of the second sidewalls 16 thereof disposed in one straight line along the width direction of the lamp tube, respectively, that is to say, being at the same side, the second sidewalls 16 form substantially a wall structure to block the user's line or sight from seeing directly at the LED light source 202. When the multiple number of the LED light sources 202 are distributed or arranged along the length direction of the lamp tube in multiple rows, the multiple number of the LED light sources 202 are distributed or arranged along the width direction, with regard to the two outermost rows of the LED light sources located along the width direction of the lamp tube, each row of the LED lead frames 202b of the multiple number of the LED light sources 202, in which all of the second sidewalls 16 disposed at the same side are in one straight line along the width direction of the lamp tube, that is to say, being at the same side, as long as the second sidewalls 16 of the LED light sources 202 located at the outermost two rows can block the user's line of sight for directly seeing the LED light sources 202, the reduction of visual graininess unpleasing effect can thereby be achieved.

Regarding the one or more middle row(s) of the LED light sources 202, the arrangement, configuration or distribution of the sidewalls are not specifically limited to any particular one, and can be same as or different from the arrangement and distribution of the two outermost rows of the LED light sources, without departing from the spirit and scope of present disclosure.

In one embodiment, the LED light bar 2 includes a dielectric layer 2b and one conductive wiring layer 2a, in which the dielectric layer 2b and the conductive wiring layer 2a are arranged in a stacked manner.

The narrowly curved end regions of the glass lamp tube 1 can reside at two ends, or can be configured at just one end thereof in different embodiments. In alternative embodiments, the LED tube lamp to further includes a diffusion layer (not shown) and a reflective film layer 12, in which the diffusion layer is disposed above the LED light sources 202, and the light emitting from the LED light sources 202 is passed through the diffusion layer and the lamp tube 1. Furthermore, the diffusion film layer can be an optical diffusion covering above the LED light sources without directly contacting thereof. In addition, the LED light sources 202 can be bondedly attached to the inner circumferential surface of the lamp tube. In other embodiments, the magnetic member 9 can be a magnetic substance that is magnetic without being made of metal. The magnetic substance can be mixed in the hot melt adhesive.

In the embodiments of present invention, the LED light bar 2 is described or mentioned interchangeably with the bendable circuit sheet 2, because in several embodiments, the LED light bar 2 is made of a bendable circuit sheet according to the disclosure of present invention (instead of being made of a conventional rigid circuit board). Thus, the bendable circuit sheet 2 and the LED light bar 2 belong to the same element throughout the instant disclosure. In addition, the soldering pad "b" is also described or mentioned interchangeably with the term "bonding pad", so that the two are the same element.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

I claim:

1. An LED tube lamp, comprising:
   a lamp tube;
   an end cap attached to an end of the lamp tube;
   a power supply disposed in the end cap; and
   an LED light bar disposed inside the lamp tube and mounted with a plurality of LED light sources, the LED light sources being electrically connected to the power supply by the LED light bar,
   wherein the LED light bar includes a bendable circuit sheet disposed with two soldering pads on the bendable circuit sheet at an end of the bendable circuit sheet, and an electrically insulating hole is formed and disposed between the two soldering pads of the bendable circuit sheet to prevent a short circuit between the two soldering pads when soldering, and
   wherein an alignment hole is configured and disposed behind the electrically insulating hole to allow a soldering machine to automatically locate the soldering pads of the bendable circuit sheet.

2. The LED tube lamp of claim 1, wherein the power supply comprises a printed circuit board disposed with two soldering pads corresponding to the two soldering pads of the bendable circuit sheet, and the two soldering pads of the bendable circuit sheet are respectively electrically connected to the two soldering pads of the printed circuit board of the power supply to provide electrical connection between the power supply and the LED light sources.

3. The LED tube lamp of claim 2, wherein the two soldering pads of the bendable circuit sheet point toward the same direction as the two soldering pads of the printed circuit board of the power supply.

4. The LED tube lamp of claim 2, wherein the two soldering pads of the bendable circuit sheet point toward opposite directions from the two soldering pads of the printed circuit board of the power supply.

5. The LED tube lamp of claim 1, wherein at least three soldering pads are disposed on the bendable circuit sheet and arranged in one row or two rows.

6. The LED tube lamp of claim 1, wherein at least one of the soldering pads is formed with a through-hole.

7. The LED tube lamp of claim 6, wherein the through-hole has a diameter of 1 mm to 2 mm.

8. The LED tube lamp of claim 6, wherein the at least one of the soldering pads of the bendable circuit board is formed with a solder ball above the through-hole after soldering is completed, and a diameter of the solder ball is larger than the diameter of the through-hole.

9. The LED tube lamp of claim 6, wherein a distance between the through-hole and an edge of the bendable circuit sheet is 1 mm or less.

10. The LED tube lamp of claim 1, wherein at least one of the soldering pads is formed with a notch at an edge of the bendable circuit sheet.

11. The LED tube lamp of claim 10, wherein the at least one of the soldering pads of the bendable circuit board is formed with a solder ball above the notch after soldering is completed, and a diameter of the solder ball is larger than a diameter of the notch.

12. An LED tube lamp, comprising:
    a lamp tube;
    an end cap attached to an end of the lamp tube;
    a power supply disposed in the end cap; and
    an LED light bar disposed inside the lamp tube and mounted with a plurality of LED light sources, the LED light sources being electrically connected to the power supply by the LED light bar;
    wherein the LED light bar includes a bendable circuit sheet with a length longer than a length of the lamp tube and is disposed with at least a first soldering pad and an electrically insulating hole at an end of the bendable circuit sheet, and the power supply is disposed with a second soldering pad corresponding to the first soldering pad of the bendable circuit sheet, and
    wherein the first soldering pad is formed with a through hole, so that upon soldering, a solder can penetrate through the through hole of the first soldering pad and accumulate around the outer periphery of the opening of the through hole, so that upon cooling and solidifying, the solder between the first soldering pad of the bendable circuit board and the second soldering pad of the power supply forms a rivet structure, wherein the electrically insulating hole is adjacent to the first soldering pad to insulate the first soldering pad, and an alignment hole is configured and disposed behind the electrically insulating hole to allow for locating the first soldering pad of the bendable circuit sheet.

13. The LED tube lamp of claim 12, wherein the first soldering pad is formed with a notch at an edge of the bendable circuit sheet.

* * * * *